United States Patent
Lee et al.

(10) Patent No.: US 12,396,333 B2
(45) Date of Patent: Aug. 19, 2025

(54) DISPLAY PANEL AND DISPLAY APPARATUS INCLUDING THE SAME

(71) Applicant: Samsung Display Co., Ltd., Yongin-Si (KR)

(72) Inventors: Wangwoo Lee, Yongin-si (KR); Sungho Kim, Yongin-si (KR); Seokje Seong, Yongin-si (KR); Jinsung An, Yongin-si (KR); Minwoo Woo, Yongin-si (KR); Jiseon Lee, Yongin-si (KR); Yoonjong Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 913 days.

(21) Appl. No.: 17/384,860

(22) Filed: Jul. 26, 2021

(65) Prior Publication Data

US 2022/0254849 A1  Aug. 11, 2022

(30) Foreign Application Priority Data

Feb. 9, 2021 (KR) .................. 10-2021-0018533

(51) Int. Cl.
*H10K 59/123* (2023.01)
*H10K 50/858* (2023.01)
(Continued)

(52) U.S. Cl.
CPC ......... *H10K 59/123* (2023.02); *H10K 50/858* (2023.02); *H10K 59/124* (2023.02); *H10K 59/131* (2023.02); *H10K 59/65* (2023.02)

(58) Field of Classification Search
CPC ........... H10K 85/00–761; H10K 77/10; H10K 77/111; H10K 59/00–88; H10K 59/173; H10K 2102/301; H10K 2102/341; H10K 2102/30; H10K 2102/361; H10K 2102/311; H10K 2101/00–80; H10K 71/831–861;
(Continued)

(56) References Cited

U.S. PATENT DOCUMENTS 9,640,681 B2   5/2017 Min
10,541,380 B1 * 1/2020 Sung .................. H10K 59/40
(Continued)

FOREIGN PATENT DOCUMENTS

CN    110874990 A    3/2020
CN    111063719 A    4/2020
(Continued)

*Primary Examiner* — Jonathan Han
(74) *Attorney, Agent, or Firm* — Innovation Counsel LLP

(57) ABSTRACT

A display panel includes: a substrate including a first area, a second area, and a third area, first display elements in the first area, and second display elements in the second area; first pixel circuits in the first area and respectively connected to the first display elements; second pixel circuits in the third area and respectively connected to the second display elements; a first organic insulating layer covering the first pixel circuits; and connection wirings respectively connecting the second pixel circuits to the second display elements, wherein the connection wirings include a first connection wiring and a second connection wiring, the first connection wiring being disposed on the first organic insulating layer, and the second connection wiring being disposed under the first organic insulating layer.

16 Claims, 21 Drawing Sheets

(51) Int. Cl.
*H10K 59/124* (2023.01)
*H10K 59/131* (2023.01)
*H10K 59/65* (2023.01)

(58) Field of Classification Search
CPC .. H10K 50/858; H10K 59/123; H10K 59/124; H10K 59/131; H10K 59/65; H10K 59/1213; H10K 59/121; H10K 59/128; B32B 2457/206; H01L 33/00–648; H01L 27/15–156; H01L 2933/00–0091
See application file for complete search history.

(56) References Cited

U.S. PATENT DOCUMENTS 10,741,625 B2  8/2020  Kang et al.
2019/0280065 A1* 9/2019  Kim .................... H10K 59/122

FOREIGN PATENT DOCUMENTS

| CN | 111725287 A | * | 9/2020 |
| KR | 10-2007-0072207 A | | 7/2007 |
| KR | 10-2019-0108220 A | | 9/2019 |
| KR | 10-2031654 B1 | | 10/2019 |
| KR | 10-2035004 B1 | | 10/2019 |

* cited by examiner

DISPLAY PANEL AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0018533, filed on Feb. 9, 2021, in the Korean Intellectual Property Office, the disclosure of which is incorporated by reference herein in its entirety.

BACKGROUND

1. Field

One or more embodiments relate to a display panel and a display apparatus including the same, and more particularly, to a display panel having a display area that extends such that an image is displayed even in a region in which a component, which is an electronic element, is arranged, and a display apparatus including the display panel.

2. Description of the Related Art

Recently, the usage of display apparatuses has diversified. In addition, as display apparatuses have become thinner and lighter, their range of use has gradually been extended.

As the display apparatuses are variously used, there may be various methods in designing the display apparatuses, and various functions that are combined or associated with display apparatuses have been added.

SUMMARY

One or more embodiments include a display panel having a display area that extends such that an image is displayed even in a region in which a component, which is an electronic element, is arranged, and a display apparatus including the display panel. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display panel includes a substrate including a first area, a second area, and a third area, a plurality of first display elements being arranged in the first area, and a plurality of second display elements being arranged in the second display area, a plurality of first pixel circuits arranged in the first area and respectively connected to the plurality of first display elements, a plurality of second pixel circuits arranged in the third area and respectively connected to the plurality of second display elements, a first organic insulating layer covering the plurality of first pixel circuits and the plurality of second pixel circuits, and a plurality of connection wirings respectively connecting the plurality of second pixel circuits to the plurality of second display elements, wherein the plurality of connection wirings include a first connection wiring and a second connection wiring, the first connection wiring being disposed on the first organic insulating layer, and the second connection wiring being disposed under the first organic insulating layer.

The display panel may further include a bottom conductive layer arranged in the first area and arranged between the substrate and the plurality of first pixel circuits, wherein the second connection wiring may be arranged on a same layer as the bottom conductive layer.

Each of the plurality of first pixel circuits may include a first thin-film transistor and a second thin-film transistor, the first thin-film transistor including a first semiconductor layer that includes a silicon semiconductor, and the second thin-film transistor including a second semiconductor layer that includes an oxide semiconductor, and the second connection wiring may be arranged on a same layer as the second semiconductor layer.

The display panel may further include a connection pad arranged on an edge of the second connection wiring, wherein a thickness of the connection pad may be greater than a thickness of the second connection wiring.

The display panel may further include a second organic insulating layer arranged on the first organic insulating layer, wherein the plurality of first display elements and the plurality of second display elements may be arranged on the second organic insulating layer, and the first connection wiring may be arranged between the first organic insulating layer and the second organic insulating layer.

Each of the plurality of first display elements may include a pixel electrode arranged on the first organic insulating layer, and the first connection wiring may be arranged on a same layer as the pixel electrode and may cover an edge of the pixel electrode.

The display panel may further include a cladding layer surrounding at least a portion of the edge of the pixel electrode, wherein the cladding layer may be provided in a ring shape.

The display panel may further include an inorganic insulating layer arranged between the substrate and the first organic insulating layer, wherein the inorganic insulating layer may include a groove disposed corresponding to the second area.

The display panel may further include a plurality of third display elements and a plurality of third pixel circuits respectively connected to the plurality of third display elements, the plurality of third pixel circuits being arranged in the third area, wherein the plurality of third pixel circuits may be alternately arranged with the plurality of second pixel circuits in the third area.

The first connection wiring may overlap at least a portion of the plurality of third pixel circuits, and the second connection wiring may be arranged in a separation portion between the plurality of second pixel circuits and the plurality of third pixel circuits.

According to one or more embodiments, a display panel includes a substrate including a first area, a second area, and a third area, a plurality of first display elements being arranged in the first area, and a plurality of second display elements being arranged in the second display area, a plurality of first pixel circuits arranged in the first area and respectively connected to the plurality of first display elements, a plurality of second pixel circuits arranged in the third area and respectively connected to the plurality of second display elements, a plurality of connection wirings respectively connecting the plurality of second pixel circuits to the plurality of second display elements, and a connection pad arranged on an edge of the plurality of connection wirings, wherein each of the plurality of first pixel circuits may include a first thin-film transistor and a second thin-film transistor, the first thin-film transistor including a first semiconductor layer that includes a silicon semiconductor, and the second thin-film transistor including a second semiconductor layer that includes an oxide semiconductor, and at least one of the plurality of connection wirings may be arranged in a same layer as the second semiconductor layer.

The connection pad may include a same material as the second semiconductor layer.

A thickness of the connection pad may be greater than a thickness of the connection wiring.

The display panel may further include a first organic insulating layer covering the plurality of first pixel circuits and the plurality of second pixel circuits, and an inorganic insulating layer arranged between the substrate and the first organic insulating layer, wherein the inorganic insulating layer may include a groove disposed corresponding to the second area.

According to one or more embodiments, a display apparatus includes a display panel including a first area, a second area, and a third area, a plurality of first display elements being arranged in the first area, and a plurality of second display elements being arranged in the second display area, and a component arranged below the display panel to correspond to the second area, wherein the display panel includes a substrate, a plurality of first pixel circuits arranged in the first area of the substrate and respectively connected to the plurality of first display elements, a plurality of second pixel circuits arranged in the third area and respectively connected to the plurality of second display elements, a first organic insulating layer covering the plurality of first pixel circuits and the plurality of second pixel circuits, and a plurality of connection wirings respectively connecting the plurality of second pixel circuits to the plurality of second display elements, wherein the plurality of connection wirings include a first connection wiring and a second connection wiring, the first connection wiring being disposed on the first organic insulating layer, and the second connection wiring being disposed under the first organic insulating layer.

The display apparatus may further include a bottom conductive layer arranged in the first region and arranged between the substrate and the plurality of first pixel circuits, wherein the second connection wiring may be arranged on a same layer as the bottom conductive layer.

Each of the plurality of first display elements may include a pixel electrode arranged on the first organic insulating layer, and the first connection wiring may be arranged on a same layer as the pixel electrode and may cover an edge of the pixel electrode.

Each of the plurality of first pixel circuits may include a first thin-film transistor and a second thin-film transistor, the first thin-film transistor including a first semiconductor layer that includes a silicon semiconductor, and the second thin-film transistor including a second semiconductor layer that includes an oxide semiconductor, and the second connection wiring may be arranged on a same layer as the second semiconductor layer.

The display apparatus may further include an inorganic insulating layer arranged between the substrate and the first organic insulating layer, wherein the inorganic insulating layer may include a groove corresponding to the second area.

The component may include a photographing element.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
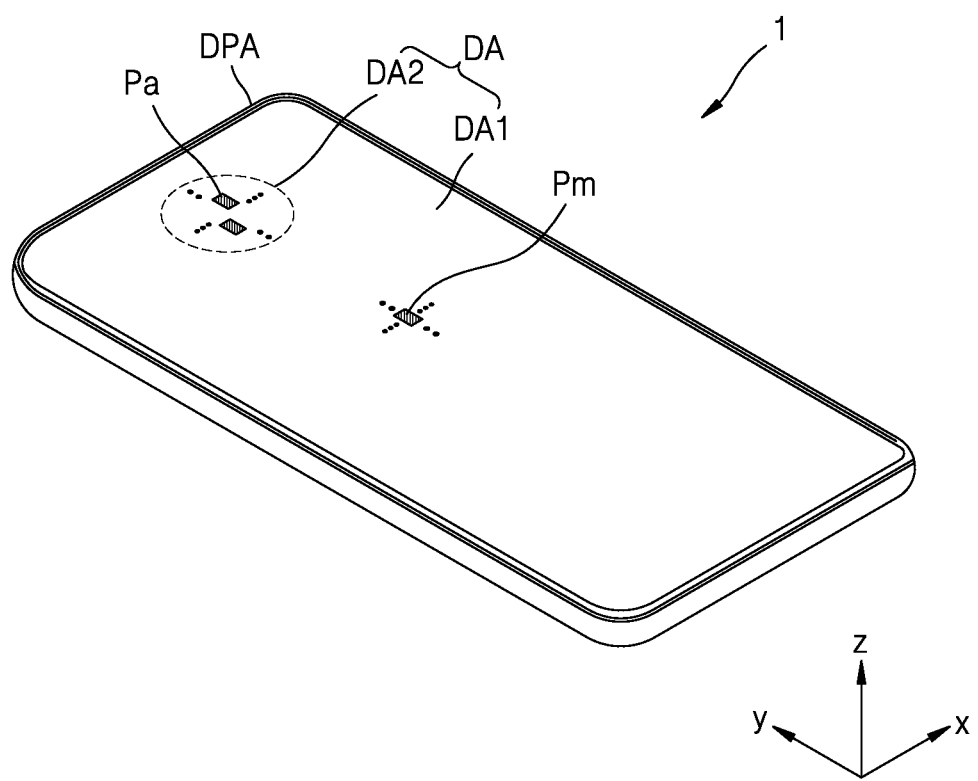
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

It will be further understood that, when a layer, region, or component is referred to as being "on" another layer, region, or component, it can be directly or indirectly on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus 1 according to an embodiment.

Referring to FIG. 1, the display apparatus 1 includes a display area DA and a peripheral area DPA outside the display area DA. The display area DA may include a first area DA1 and a second area DA2. The first area DA1 may surround at least a portion of the second area DA2. The first area DA1 may be a main display area, and the second area DA2 may be an auxiliary display area or a component area in which a component is arranged. That is, the first area DA1 and the second area DA2 may display an image individually or in cooperation with each other. The peripheral area DPA may be a kind of non-display area in which display elements are not arranged. The display area DA may be entirely surrounded by the peripheral area DPA.

It is shown in FIG. 1 that one second area DA2, in which a component is arranged, is arranged inside the first area DA1. In another embodiment, the display apparatus 1 may include two or more second areas DA2. The shapes and the sizes of the plurality of second areas DA2 may be different from each other. The second area DA2 may have various shapes such as circular shapes, polygonal shapes including quadrangles, star shapes, or diamond shapes in a plan view. In addition, though it is shown in FIG. 1 that the second area DA2 is arranged on an upper center (a+y-direction) of the first area DA1 having an approximately quadrangular shape, the second area DA2 may be arranged on one side of the first area DA1, for example, on the right upper side or the left upper side of the first area DA1 in a plan view.

The display apparatus 1 may display an image through a plurality of first pixels Pm and a plurality of second pixels Pa, the plurality of first pixels Pm being arranged in the first area DA1 and the plurality of second pixels Pa being arranged in the second area DA2.

The plurality of second pixels Pa may be arranged in the second area DA2. The plurality of second pixels Pa may display a preset image by emitting light. An image displayed in the second area DA2 is an auxiliary image and may have a resolution less than the resolution of an image displayed in the first area DA1.

A component 40 (see FIG. 2), which is an electronic element, may be arranged in the second area DA2 below the display panel. The component 40 is a camera that uses an infrared ray or a visible ray and may include a photographing element. Alternatively, the component 40 may include a solar battery, a flash, an illuminance sensor, a proximity sensor, and an iris sensor. Alternatively, the component 40 may have a function of receiving sound. To prevent the function of the component 40 from being limited, a second pixel circuit that drives the second pixel Pa arranged in the second area DA2 may not be arranged in the second area DA2 and may be arranged in a third area AR3. In an embodiment, the third area AR3 may be the peripheral area DPA. In another embodiment, the third area AR3 may be a display area arranged between the first area DA1 and the second area DA2 and configured to display an image.

In the display panel and the display apparatus including the display panel according to an embodiment, when light passes through the second area DA2, a light transmittance thereof may be 10% or more, more preferably 40% or more, 25% or more, 50% or more, 85% or more, or 90% or more.

Figure 2:
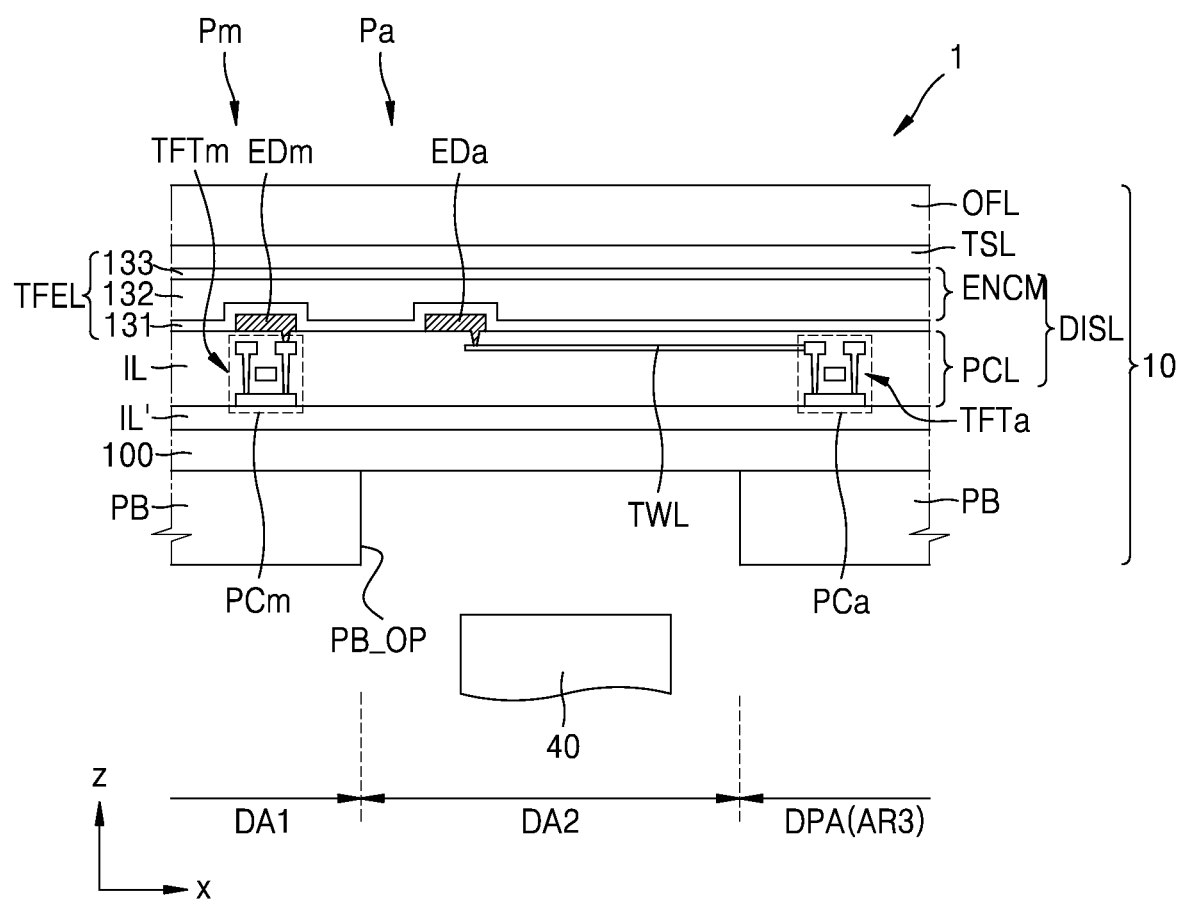
FIG. 2 is a cross-sectional view of a portion of a display apparatus according to an embodiment.

FIG. 2 is a cross-sectional view of a portion of the display apparatus 1 according to an embodiment.

Referring to FIG. 2, the display apparatus 1 may include a display panel 10 and the component 40 overlapping the display panel 10. A cover window (not shown) may be further arranged on the display panel 10 to protect the display panel 10.

The display panel 10 includes the second area DA2 and the first area DA1, the second area DA2 overlapping the component 40, and a main image being displayed in the first area DA1. The display panel 10 may include a substrate 100, a display layer DISL, a touchscreen layer TSL, an optical functional layer OFL over the substrate 100, and a panel protecting layer PB, the panel protecting layer PB being disposed under the substrate 100.

The display layer DISL may include a circuit layer PCL, a display element layer, and an encapsulation layer ENCM, the circuit layer PCL including thin-film transistors TFTm and TFTa, the display element layer including light-emitting elements, that is, first and second light-emitting elements EDm and EDa, which are display elements, and the encapsulation layer ENCM including a thin-film encapsulation layer TFEL or an encapsulation substrate (not shown). An insulating layer IL' may be arranged between the substrate 100 and the display layer DISL, and the display layer DISL may include an insulating layer IL.

The substrate 100 may include an insulating material such as glass, quartz, and a polymer resin. The substrate 100 may be a rigid substrate or a flexible substrate that is bendable, foldable, or rollable.

A first pixel circuit PCm and a first display element EDm connected thereto may be arranged in the first area DA1 of the display panel 10. The first pixel circuit PCm may include at least one thin-film transistor TFTm and control light emission of the first display element EDm. The first pixel Pm may emit light through light emission of the first display element EDm.

The second display element EDa may be arranged in the second area DA2 of the display panel 10 to implement the second pixel Pa. The second area DA2 is an auxiliary display area and may have a resolution less than the resolution of the first area DA1. That is, the number of second display elements EDa per unit area in the second area DA2 may be less than the number of first display elements EDm per unit area in the first area DA1.

In an embodiment, the second pixel circuit PCa that drives the second display element EDa may not be arranged in the second area DA2 and may be arranged in the third area AR3. In an embodiment, the third area AR3 may be the peripheral area DPA, which is a non-display area. In another embodiment, the third area AR3 may be arranged between the first area DA1 and the second area DA2. However, various modifications may be made. That is, the second pixel circuit PCa may be arranged not to overlap the second display element EDa.

The second pixel circuit PCa may include at least one thin-film transistor TFTa and be electrically connected to the second display element EDa through a connection wiring TWL. The connection wiring TWL may include a transparent conductive material. The second pixel circuit PCa may be configured to control light emission of the second display element EDa. The second pixel Pa may emit light through light emission of the second display element EDa.

In addition, the second area DA2 may be a region through which light/signal emitted from the component 40 or light/ signal incident to the component 40 may pass. Because only the second display element EDa and the connection wiring TWL including a transparent conductive material are arranged in the second area DA2, and the number of second display elements EDa per unit area in the second area DA2 is less than the number of first display elements EDm per unit area in the first area DA1, a light transmittance of the second area DA2 may be increased.

The first display element EDm and the second display element EDa, which are display elements, may be covered by the thin-film encapsulation layer TFEL or the encapsulation substrate. In an embodiment, the thin-film encapsulation layer TFEL may include at least one inorganic encapsulation layer and at least one organic encapsulation layer as shown in FIG. 2. In an embodiment, the thin-film encapsulation layer TFEL may include first and second inorganic encapsulation layers 131 and 133, and an organic encapsulation layer 132 disposed therebetween.

The first inorganic encapsulation layer 131 and the second inorganic encapsulation layer 133 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed through chemical vapor deposition (CVD), etc. The organic encapsulation layer 132 may include a polymer-based material. The polymer-based material may include a silicon-based resin, an acryl-based resin, an epoxy-based resin, polyimide, and polyethylene.

The first inorganic encapsulation layer 131, the organic encapsulation layer 132, and the second inorganic encapsulation layer 133 may be formed as one body to cover the first area DA1 and the second area DA2.

In the case where the first display element EDm and the second display element EDa are encapsulated by the encapsulation substrate (not shown), the encapsulation substrate may face the substrate 100 with the display elements disposed therebetween. There may be a gap between the encapsulation substrate and the display elements. The encapsulation substrate may include glass. Sealant including frit may be arranged between the substrate 100 and the encapsulation substrate. The sealant may be arranged in the peripheral area DPA. The sealant arranged in the peripheral area DPA surrounds the display area DA and prevents moisture from penetrating to the display area DA through the lateral surface of the display area DA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input through a self-capacitive method or a mutual capacitive method.

The touchscreen layer TSL may be formed on the thin-film encapsulation layer TFEL. Alternatively, the touchscreen layer TSL may be separately formed on a touch substrate and then coupled to the thin-film encapsulation layer TFEL through an adhesive layer such as an optically clear adhesive (OCA). In an embodiment, the touchscreen layer TSL may be directly formed on the thin-film encapsulation layer TFEL. In this case, the adhesive layer may not be arranged between the touchscreen layer TSL and the thin-film encapsulation layer TFEL.

The optical functional layer OFL may include an anti-reflection layer. The anti-reflection layer may reduce the reflectivity of light (external light) incident toward the display apparatus 1 from the outside. In an embodiment, the optical functional layer OFL may be a polarizing film. In an embodiment, the optical functional layer OFL may include a filter plate including a black matrix and color filters.

The panel protecting layer PB may be attached under the substrate 100 to support and protect the substrate 100. The panel protecting layer PB may include an opening PB_OP corresponding to the second area DA2. Because the opening PB_OP is provided in the panel protecting layer PB, a light transmittance of the second area DA2 may be improved. The panel protecting layer PB may include polyethylene terephthalate (PET) or polyimide (PI).

The area of the second area DA2 may be greater than the area in which the component 40 is arranged. Accordingly, the area of the opening PB_OP of the panel protecting layer PB may not coincide with the area of the second area DA2.

In addition, a plurality of components 40 may be arranged in the second area DA2. The plurality of components 40 may have different functions. As an example, the plurality of components 40 may include at least two of a camera (a photographing element), a solar battery, a flash, a proximity sensor, an illuminance sensor, and an iris sensor.

Figure 3:
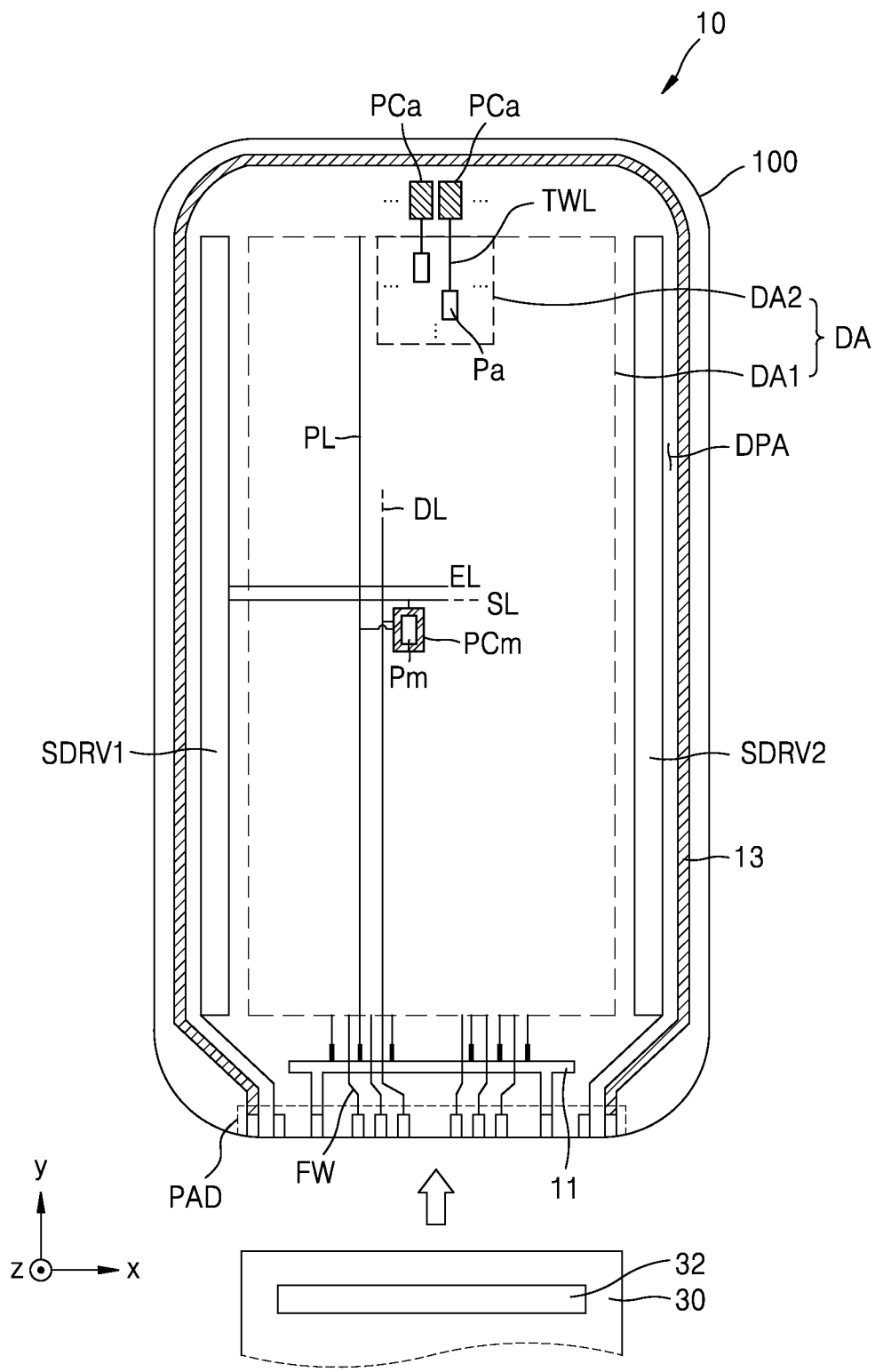
FIG. 3 is a plan view of a display panel that may be included in the display apparatus of FIG. 1 according to an embodiment.

FIG. 3 is a plan view of a display panel that may be included in the display apparatus of FIG. 1 according to an embodiment.

Referring to FIG. 3, various kinds of elements constituting the display panel 10 are arranged on the substrate 100. The substrate 100 includes the display area DA and the peripheral area DPA surrounding the display area DA. The display area DA includes the first area DA1 and the second area DA2. A main image is displayed in the first area DA1 and an auxiliary image is displayed in the second area DA2. The auxiliary image may constitute an entire image in cooperation with the main image and the auxiliary image may be an image independent of the main image.

A plurality of first pixels Pm are arranged in the first area DA1. Each of the first pixels Pm may be implemented as a display element such as an organic light-emitting diode OLED. A first pixel circuit PCm that drives the first pixel Pm may be arranged in the first area DA1 and may overlap the first pixel Pm. Each first pixel Pm may emit, for example, red, green, blue, or white light. The first area DA1 may be covered by the encapsulation layer and protected from external air or moisture, etc.

As described above, the second area DA2 may be arranged on one side of the first area DA1, or arranged inside the display area DA and surrounded by the first area DA1. A plurality of second pixels Pa are arranged in the second area DA2. Each of the second pixels Pa may be implemented as a display element such as an organic light-emitting diode OLED. A second pixel circuit PCa that drives the second pixel Pa may be arranged in the peripheral area DPA that is close to the second area DA2. As an example, in the case where the second area DA2 is arranged on the upper side of the display area DA, the second pixel circuit PCa may be arranged on the upper side of the peripheral area DPA. A display element in the second pixel Pa may be connected to the second pixel circuit PCa by the connection wiring TWL extending in a y-direction. Each second pixel Pa may emit, for example, red, green, blue, or white light. The second area DA2 may be covered by the encapsulation layer and protected from external air or moisture, etc.

The resolution of the second area DA2 may be about ½, ⅜, ⅓, ¼, 2/9, ⅛, 1/9, and 1/16 of the resolution of the first area DA1. As an example, the resolution of the first area DA1 may be 400 ppi or more and the resolution of the second area DA2 may be about 200 ppi or about 100 ppi.

Each of pixel circuits that drive the pixels, that is, the first and second pixels Pm and Pa, may be electrically connected to outer circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may be configured to apply a scan signal to each of the first pixel circuits PCm that drive the first pixels Pm through a main scan line SL (see FIG. 3). The first scan driving circuit SDRV1 may be configured to apply an emission control signal to each pixel circuit through a main emission control line EL. The second scan driving circuit SDRV2 may be arranged opposite to the first scan driving circuit SDRV1 with the display area DA disposed therebetween and extend approximately parallel to the first scan driving circuit SDRV1. Some of the pixel circuits corresponding to the first pixels Pm in the first area DA1 may be electrically connected to the first scan driving circuit SDRV1, and the rest of the pixel circuits may be electrically connected to the second scan driving circuit SDRV2.

The terminal portion PAD may be arranged on one side of the substrate 100. The terminal portion PAD is exposed and connected to a display circuit board 30 through openings in an insulating layer. A display driver 32 may be arranged on the display circuit board 30.

The display driver 32 may generate a control signal to be transferred to the first scan driving circuit SDRV1 and the second scan driving circuit SDRV2. The display driver 32 generates a data signal. The generated data signal may be transferred to the first pixel circuit PCm through a fan-out wiring FW and a main data line DL (see FIG. 3) connected to the fan-out wiring FW.

The display driver 32 may supply a driving voltage ELVDD to a driving voltage supply line 11 and supply a common voltage ELVSS to the common voltage supply line 13. The driving voltage ELVDD may be applied to the pixel circuits of the pixels, that is, the first and second pixels Pm and Pa, through a driving voltage line PL connected to the driving voltage supply line 11 and the common voltage ELVSS may be connected to the common voltage supply line 13 and applied to an opposite electrode of a display element.

The driving voltage supply line 11 may extend in an x-direction below the first area DA1. The common voltage supply line 13 may have a loop shape having one open side to surround a portion of the first area DA1.

Though it is shown in FIG. 3 that there is one second area DA2, the second area DA2 may be provided in a plurality. In this case, the plurality of second areas DA2 are spaced apart from each other. A first camera may be arranged to correspond to one second area DA2, and a second camera may be arranged to correspond to another second area DA2. Alternatively, a camera may be arranged to correspond to one second area DA2 and an infrared sensor may be arranged to correspond to another second area DA2. The shapes and the sizes of the plurality of second areas DA2 may be different from each other.

The second area DA2 may have a circular shape, an elliptical shape, a polygonal shape, or an irregular shape. In an embodiment, the second area DA2 may have an octagonal shape. The second area DA2 may have various shapes of polygons such as a quadrangle and a hexagon. The second area DA2 may be surrounded by the first area DA1.

Figure 4:
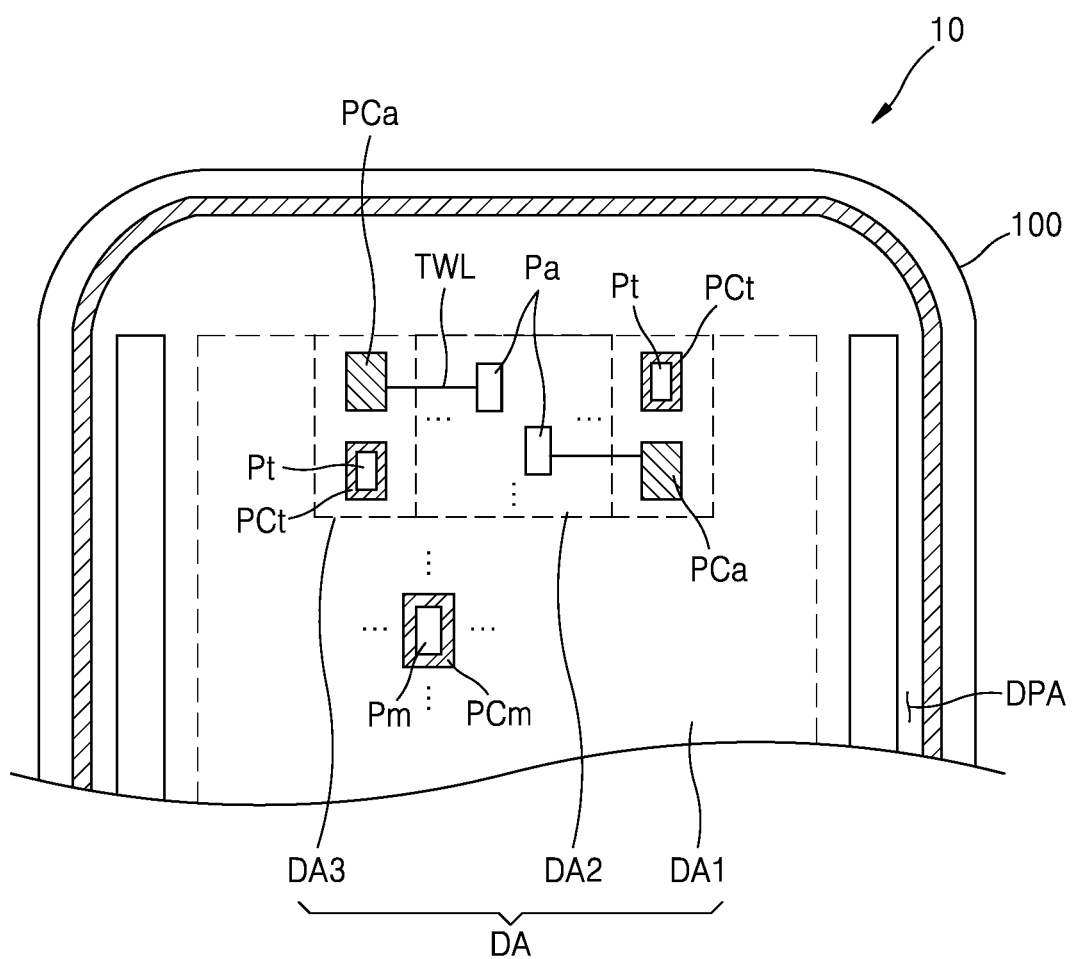
FIG. 4 is a plan view of a display panel that may be included in the display apparatus of FIG. 1 according to an embodiment.
Figure 5:
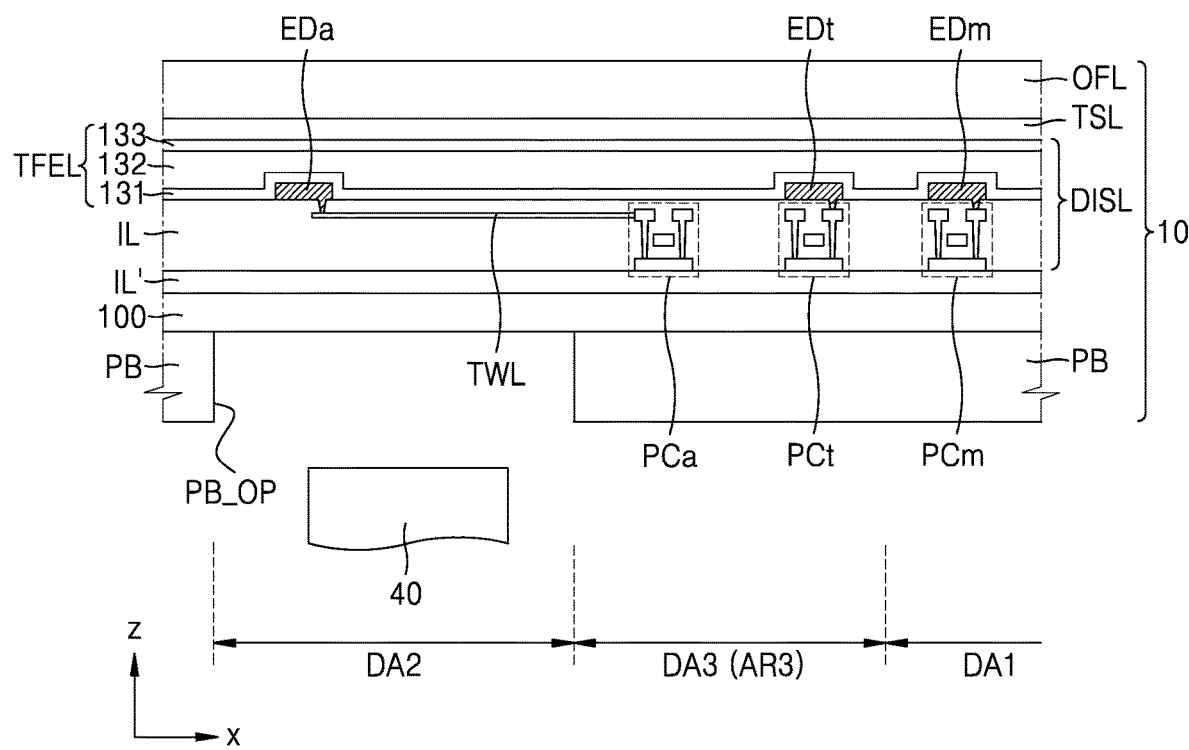
FIG. 5 is a cross-sectional view of the display panel of FIG. 4.

FIG. 4 is a plan view of a display panel that may be included in the display apparatus of FIG. 1 according to an embodiment. FIG. 5 is a cross-sectional view of the display panel of FIG. 4. In FIGS. 4 and 5, because the same reference numerals as those of FIGS. 2 and 3 denote the same elements, repeated descriptions thereof are omitted.

Referring to FIGS. 4 and 5, the display area DA of the substrate 100 includes the first area DA1, the second area DA2, and a third display area DA3 disposed between the first area DA1 and the second area DA2.

The first area DA1 may be an area in which a main image is displayed. The second area DA2 and the third display area DA3 may be areas in which an auxiliary image is displayed. An auxiliary image may constitute one entire image in cooperation with a main image or an image independent of the main image.

The third display area DA3 may be arranged on at least one side of the second area DA2. Though it is shown in FIG. 4 that the third display areas DA3 are arranged on the left side and right side of the second area DA2, the embodiment is not limited thereto. The third display areas DA3 may be arranged above and below the second area DA2 or arranged to surround the second area DA2. However, various modifications may be made.

A plurality of third pixels Pt are arranged in the third display area DA3. Each of the plurality of third pixels Pt may be implemented by a display element such as an organic light-emitting diode OLED. A third pixel circuit PCt that drives the third pixel Pt is arranged in the third display area DA3. The third pixel circuit PCt may overlap the third pixel Pt. Each third pixel Pt may emit, for example, red, green, blue, or white light. The third display area DA3 may be covered by the encapsulation layer and protected from external air or moisture, etc.

The second pixel circuit PCa that drives the second pixel Pa of the second area DA2 is arranged in the third display area DA3. That is, the third display area DA3 may serve as the third area AR3 described above. The second pixel circuit PCa and the third pixel circuit PCt may be alternately arranged in the third display area DA3. The second display element EDa that constitutes the second pixel Pa may be connected to the second pixel circuit PCa through the connection wiring TWL extending in the x-direction.

The resolution of the third display area DA3 may be the same as the resolution of the second area DA2. Alternatively, the resolution of the third display area DA3 may be greater than the resolution of the second area DA2 and less than the resolution of the first area DA1.

As an example, the resolution of the third display area DA3 may be about $½$, $⅜$, $⅓$, $¼$, $⅖$, $⅛$, $⅑$, and $1/16$ of the resolution of the first area DA1. As an example, the resolution of the first area DA1 may be 400 ppi or more, and the resolution of the third area DA3 may be about 200 ppi or about 100 ppi.

In an embodiment, the first pixel circuit PCm, the second pixel circuit PCa, and the third pixel circuit PCt may have the same configuration. However, the embodiment is not limited thereto. The first pixel circuit PCm, the second pixel circuit PCa, and the third pixel circuit PCt may have different configurations from each other. However, various modifications may be made.

Figure 6:
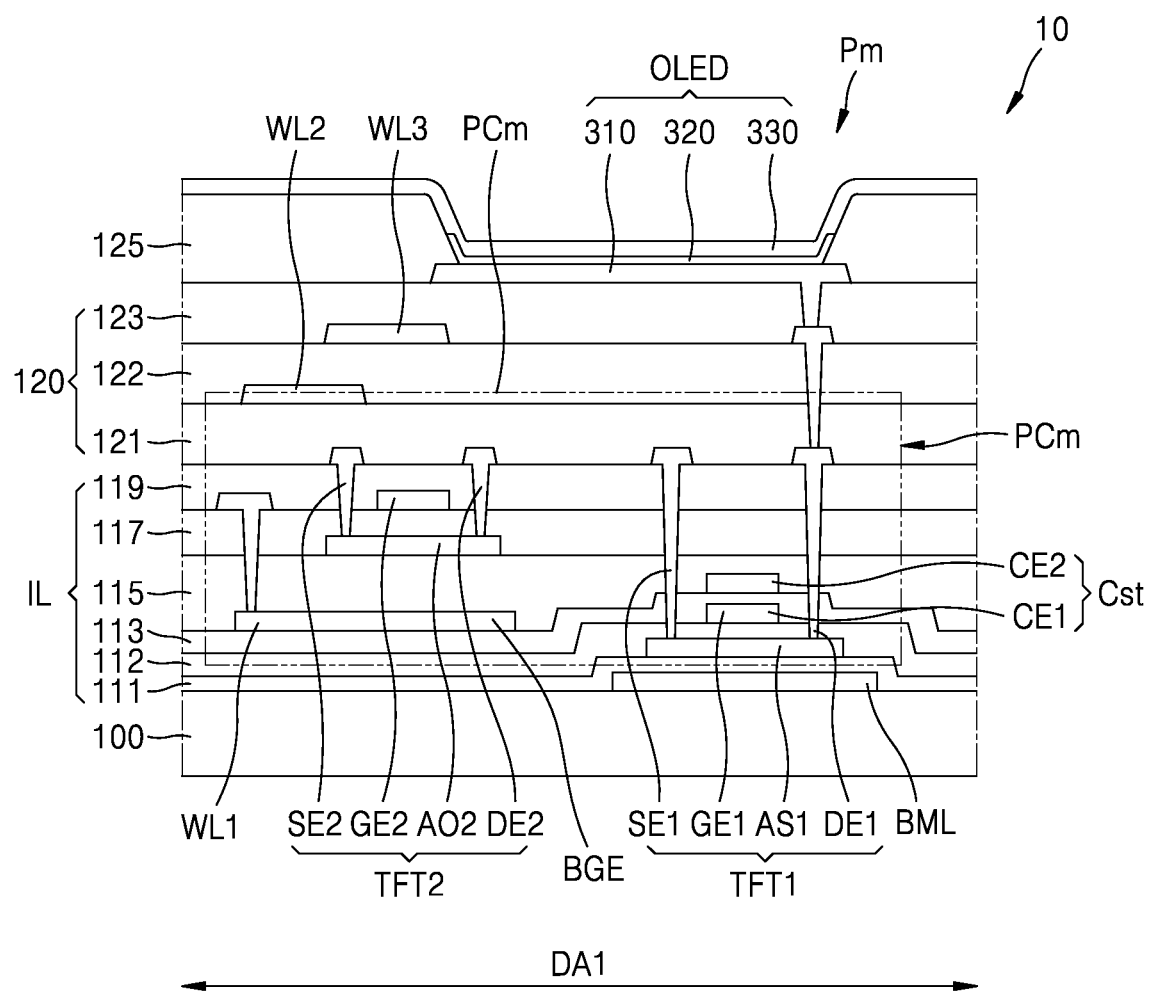
FIG. 6 is a cross-sectional view of a portion of a display panel according to an embodiment.

FIG. 6 is a cross-sectional view of a portion of a display panel according to an embodiment and is a cross-sectional view of a portion of the first area DA1.

Referring to FIG. 6, the first pixel circuit PCm and an organic light-emitting diode OLED as a first display element are arranged in the first area DA1 of the substrate 100 of the display panel 10, the organic light-emitting diode OLED being connected to the first pixel circuit PCm. In addition, a bottom conductive layer BML may be further arranged between the substrate 100 and the first pixel circuit PCm.

The first pixel circuit PCm according to an embodiment includes a first thin-film transistor TFT1 and a second thin-film transistor TFT2, the first thin-film transistor TFT1 including a silicon semiconductor and the second thin-film transistor TFT2 including an oxide semiconductor. The first pixel circuit PCm may further include a storage capacitor Cst.

The first thin-film transistor TFT1 includes a first semiconductor layer AS1 and a first gate electrode GE1, the first semiconductor layer AS1 including a silicon semiconductor, and the first gate electrode GE1 being insulated from the first semiconductor layer AS1. The first thin-film transistor TFT1 may include a source electrode SE1 and/or a first drain electrode DE1 connected to the first semiconductor layer AS1. The first thin-film transistor TFT1 may serve as a driving thin-film transistor.

The second thin-film transistor TFT2 includes a second semiconductor layer AO2 and a second gate electrode GE2, the second semiconductor layer AO2 including an oxide semiconductor and the second gate electrode G2 being insulated from the second semiconductor layer AO2. The second thin-film transistor TFT2 may include a second source electrode SE2 and/or a second drain electrode DE2 connected to the second semiconductor layer AO2. The second thin-film transistor TFT2 may serve as a switching thin-film transistor. Alternatively, the second thin-film transistor 220 may be any thin-film transistor other than a driving thin-film transistor.

In an embodiment, the first semiconductor layer AS1 of the first thin-film transistor TFT1 serving as the driving thin-film transistor may include polycrystalline silicon having excellent reliability, and the second semiconductor layer AO2 of the second thin-film transistor TFT2 corresponding to the switching thin-film transistor TFT2 may include an oxide semiconductor having a small leakage current.

In detail, the driving thin-film transistor that directly influences the brightness of a display element may be configured to include a semiconductor layer including polycrystalline silicon having a high reliability. Through this, a high-resolution display apparatus may be implemented.

Because a thin-film transistor including an oxide semiconductor has a high carrier mobility and a low leakage current, a voltage drop is not large even when a driving time is long. When a thin-film transistor including an oxide semiconductor is used, a color change of an image resulting from a voltage drop is not large even though the thin-film transistor is driven in low frequencies. Accordingly, in the case where a driving circuit includes a thin-film transistor including a semiconductor layer that includes an oxide semiconductor, power consumption of the driving circuit may be lowered than power consumption of the case where all of thin-film transistors of a driving circuit include polycrystalline silicon.

In an embodiment, because at least one of the rest of thin-film transistors except for the driving thin-film transistor includes an active layer including an oxide semiconductor, the power consumption of the display apparatus may be reduced.

In addition, the bottom conductive layer BML is arranged below the first thin-film transistor TFT1 according to an embodiment, the bottom conductive layer BML overlapping the first thin-film transistor TFT1. A constant voltage may be applied to the bottom conductive layer BML. Because the bottom conductive layer BML is arranged below the first thin-film transistor TFT1, the first thin-film transistor TFT1 is less influenced by ambient interfering signals, and thus, reliability may be improved even more.

Though an embodiment is an example in which an organic light-emitting diode is employed as a display element, an inorganic light-emitting element or a quantum-dot light-emitting element may be employed as a display element in another embodiment.

Hereinafter, a structure in which elements of the display panel 10 are stacked is described.

The substrate 100 may include an insulating material such as glass, quartz, and a polymer resin. The substrate 100 may be a rigid substrate or a flexible substrate that is bendable, foldable, or rollable. The substrate 100 may have a multi-layered structure including a single layer or a multi-layer including the above materials. In the case where the substrate 100 has a multi-layered structure, the substrate 100 may further include an inorganic layer. In an embodiment, the substrate 100 may have a structure of an organic material/an inorganic material/an organic material.

A buffer layer 111 may be arranged on the substrate 100. The buffer layer 111 may reduce or block the penetration of foreign material, moisture, or external air from below the substrate 100, and provide a flat surface on the substrate 100. The buffer layer 111 may include an inorganic material such as an oxide or a nitride, an organic material, or an organic/inorganic composite material, and have a single-layered structure or a multi-layered structure of an inorganic material and an organic material. In an embodiment, the buffer layer 111 may include silicon oxide ($SiO_2$) or silicon nitride ($SiN_x$).

The bottom conductive layer BML may be arranged between the substrate 100 and the buffer layer 111. The bottom conductive layer BML may include a conductive material. In an embodiment, the bottom conductive layer BML may include a transparent conductive material. As an example, the bottom conductive layer BML may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The bottom conductive layer BML may overlap the first thin-film transistor TFT1, and a constant voltage may be applied to the bottom conductive layer BML. A barrier layer (not shown) may be further arranged between the substrate 100 and the bottom conductive layer BML, the barrier layer blocking the penetration of external air. The barrier layer may include an inorganic material such as an oxide or a nitride, an organic material, or an organic/inorganic composite material, and have a single-layered structure or a multi-layered structure of an inorganic material and an organic material.

The first semiconductor layer AS1 including a silicon semiconductor may be arranged on the buffer layer 111. The first semiconductor layer AS1 may include polycrystalline silicon or amorphous silicon. The first semiconductor layer AS1 may include a channel region, a source region, and a drain region, the source region and the drain region being doped with impurities.

A first gate insulating layer 112 may be arranged to cover the first semiconductor layer AS1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), and titanium oxide ($TiO_2$). The first gate insulating layer 112 may include a single layer or a multi-layer including the inorganic insulating material.

A first gate electrode GE1 is arranged on the first gate insulating layer 112 to overlap the first semiconductor layer AS1. The first gate electrode GE1 may include a single layer or a multi-layer including molybdenum (Mo), aluminum (Al), copper (Cu), and titanium (Ti) and include a single layer or a multi-layer. As an example, the first gate electrode GE1 may include a single Mo layer.

A first interlayer insulating layer 113 may be provided to cover the first gate electrode GE1. The first interlayer insulating layer 113 may include an inorganic insulating material such as silicon oxide ($SiO_2$), silicon nitride ($SiN_x$), silicon oxynitride ($SiO_xN_y$), aluminum oxide ($Al_2O_3$), and titanium oxide ($TiO_2$). The first interlayer insulating layer 113 may include a single layer or a multi-layer including the inorganic insulating material.

A storage capacitor Cst may include the gate electrode GE1 as a bottom electrode and a top electrode CE2. The first interlayer insulating layer 113 may be arranged between the bottom electrode CE1 and the top electrode CE2. In this case, the first gate electrode GE1 may serve as not only a gate electrode of the first thin-film transistor TFT1 but also the bottom electrode CE1 of the storage capacitor Cst. That is, the first gate electrode GE1 and the bottom electrode CE1 may be one body. The top electrode CE2 is arranged on the first interlayer insulating layer 113 to overlap at least a portion of the bottom electrode CE1.

A first wiring WL1 and a bottom gate electrode BGE may be arranged on the first interlayer insulating layer 113. The first wiring WL1 may be configured to transfer a signal transferred to the first thin-film transistor TFT1 or the second thin-film transistor TFT2. The bottom gate electrode BGE may overlap the second semiconductor layer AO2 of the second thin-film transistor TFT2 to apply a gate signal to the second thin-film transistor TFT2. In this case, the second thin-film transistor TFT2 may have a double gate electrode structure in which gate electrodes are arranged over and below the second semiconductor layer AO2.

The bottom gate electrode BGE may be provided as a portion of the first wiring WL1. In this case, the first wiring WL1 may be configured to transfer a gate signal to the second thin-film transistor TFT2.

The first interlayer insulating layer 113 may include an inorganic material including an oxide or a nitride. As an example, the first interlayer insulating layer 113 may include silicon oxide ($SiO_2$), silicon nitride ($SiN_x$), silicon oxynitride (SiON), aluminum oxide ($Al_2O_3$), and/or titanium oxide ($TiO_2$).

A second interlayer insulating layer 115 may cover the top electrode CE2, the first wiring WL1, and the bottom gate electrode BGE. The second interlayer insulating layer 115 may include silicon oxide ($SiO_2$), silicon nitride ($SiN_x$), silicon oxynitride (SiON), aluminum oxide ($Al_2O_3$), and/or titanium oxide ($TiO_2$). The second interlayer insulating layer 115 may include a single layer or a multi-layer including the inorganic insulating material.

The second semiconductor layer AO2 may be arranged on the second interlayer insulating layer 115, the second semiconductor layer AO2 including an oxide semiconductor. The second semiconductor layer AO2 may include a channel region, a source region, and a drain region, the source region and the drain region being disposed on two opposite sides of the channel region. The second semiconductor layer AO2 may include an oxide of at least one of indium (In), gallium (Ga), stannum (Sn), zirconium (Zr), hafnium (Hf), titanium (Ti), and zinc (Zn). In an embodiment, the second semiconductor layer AO2 may include In—Ga—Zn—O (IGZO) containing metal such as indium (In) and gallium (Ga) in ZnO.

The source region and the drain region of the second semiconductor layer AO2 may be formed by adjusting carrier concentration of an oxide semiconductor and making the source region and the drain region conductive. For example, the source region and the drain region of the second semiconductor layer AO2 may be formed by increasing carrier concentration through plasma treatment that uses a hydrogen (H)-based gas, a fluorine (F)-based gas, or a combination of these performed on the oxide semiconductor.

The second gate electrode GE2 may be arranged over the second semiconductor layer AO2. A second gate insulating layer 117 may be arranged between the second semiconductor layer AO2 and the second gate electrode GE2. The second gate electrode GE2 may overlap the second semiconductor layer AO2 and be insulated from the second semiconductor layer AO2 by the second gate insulating layer 117.

The second gate insulating layer 117 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 117 may include a single layer or a multi-layer including the above inorganic insulating material.

A third interlayer insulating layer 119 may be arranged on the second gate electrode GE2. A first source electrode SE1 and/or a first drain electrode DE1, and a second source electrode SE2 and/or a second drain electrode DE2 may be arranged on the third interlayer insulating layer 119, the first source electrode SE1 and/or the first drain electrode DE1 being connected to the first semiconductor layer AS1, and the second source electrode SE2 and/or the second drain electrode DE2 being connected to the second semiconductor layer AO2. Alternatively, a data line and a driving voltage line may be arranged on the third interlayer insulating layer 119, the data line being configured to transfer a data signal, and the driving voltage line being configured to transfer a driving voltage. The first source electrode SE1, the first drain electrode DE1, the second source electrode SE2, and the second drain electrode DE2 may be connected to the data line or the driving voltage line directly or through another thin-film transistor.

The third interlayer insulating layer 119 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The third interlayer insulating layer 119 may include a single layer or a multi-layer including the above inorganic insulating material.

The first source electrode SE1 and/or the first drain electrode DE1, and the second source electrode SE2 and/or the second drain electrode DE2 may include a material having a high conductivity such as metal, a conductive oxide, etc. As an example, the first source electrode SE1 and/or the first drain electrode DE1, and the second source electrode SE2 and/or the second drain electrode DE2 may include a single layer or a multi-layer including aluminum (Al), copper (Cu), and/or titanium (Ti). In an embodiment, the first source electrode SE1 and/or the first drain electrode DE1, and the second source electrode SE2 and/or the second drain electrode DE2 may include a triple layer of titanium, aluminum, and titanium (Ti/Al/Ti) that are sequentially stacked.

An organic insulating layer 120 is arranged on the first source electrode SE1 and/or the first drain electrode DE1, and the second source electrode SE2 and/or the second drain electrode DE2. The organic insulating layer 120 may include a single layer or a multi-layer. As an example, the organic insulating layer 120 may include a first organic insulating layer 121, a second organic insulating layer 122, and a third organic insulating layer 123 that are stacked. In this case, a second wiring WL2 may be arranged on the first organic insulating layer 121. A third wiring WL3 may be arranged on the second organic insulating layer 122. The second wiring WL2 and the third wiring WL3 may be configured to transfer various signals and/or voltages to the first pixel circuit PCm.

The organic insulating layer 120 may include a general-purpose polymer such as polyimide, polystyrene (PS), polycarbonate (PC), benzocyclobutene (BCB), polyimide, hexamethyldisiloxane (HMDSO), polymethylmethacrylate (PMMA), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer.

Alternatively, the organic insulating layer 120 may include siloxane-based organic material. Siloxane-based organic material may include hexamethyldisiloxane, octamethyltrisiloxane, decamethyltetrasiloxane, dodecamethylpentasiloxane, and polydimethylsiloxanes. The organic insulating layer 120 may serve as a protection layer covering thin-film transistors. All of the first organic insulating layer 121, the second organic insulating layer 122, and the third organic insulating layer 123 may include the same material, or at least one of the first organic insulating layer 121, the second organic insulating layer 122, and the third organic insulating layer 123 may include a different material.

An organic light-emitting diode OLED may be arranged on the organic insulating layer 120, the organic light-emitting diode OLED including a pixel electrode 310, an opposite electrode 330, and an intermediate layer 320 disposed therebetween, the intermediate layer 320 including an emission layer.

The pixel electrode 310 may be connected to the first drain electrode DE1 through a contact hole defined in the organic insulating layer 120 and be connected to a first drain region D1 of the first thin-film transistor TFT1. The pixel electrode 310 may be directly connected to the first thin-film transistor TFT1 or indirectly connected to the first thin-film transistor TFT1 through another thin-film transistor (not shown) configured to control light emission.

The pixel electrode 310 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 310 may include a reflective layer including silver (Ag), magnesium (Mg), aluminum (Al), or a compound thereof. As an example, the pixel electrode 310 may have a structure including layers that include ITO, IZO, ZnO, or $In_2O_3$ on and under the reflective layer. In this case, the pixel electrode 310 may have a structure of ITO/Ag/ITO that are stacked.

A pixel-defining layer 125 may be arranged on the organic insulating layer 120. The pixel-defining layer 125 may cover the edges of the pixel electrode 310 and define a light emitting area by including an opening that exposes the central portion of the pixel electrode 310. In addition, the pixel-defining layer 125 may prevent an arc, etc. from occurring at the edges of the pixel electrode 310 by increasing a distance between the edges of the pixel electrode 310 and the opposite electrode 330 over the pixel electrode 310. The pixel-defining layer 125 may include an organic insulating material such as polyimide, polyamide, an acrylic resin, benzocyclobutene, hexamethyldisiloxane (HMDSO), and a phenolic resin and be formed through spin coating, etc.

The intermediate layer 320 of the organic light-emitting diode OLED may include a low molecular weight material or a polymer material and emit red, green, blue, or white light. In the case where the intermediate layer 320 includes a low molecular weight material, the intermediate layer 320 may have a structure in which a hole injection layer (HIL), a hole transport layer (HTL), an emission layer (EML), an electron transport layer (ETL), an electron injection layer (EIL), etc. are stacked in a single or composite configuration. The intermediate layer 320 may include various organic materials such as copper phthalocyanine (CuPc), N, N'-Di (naphthalene-1-yl)-N, N'-diphenyl-benzidine (NPB), and tris-8-hydroxyquinoline aluminum (Alq3). These layers may be formed by vacuum deposition.

In the case where the intermediate layer 320 includes a polymer material, the intermediate layer 320 may have a structure including an HTL and an EML. In this case, the HTL may include poly(3,4-ethylenedioxythiophene) (PEDOT), and the EML may include a polymer material such as a polyphenylene vinylene (PPV)-based material and a polyfluorene-based material. The intermediate layer 320 may be formed through screen printing, inkjet printing, or laser induced thermal imaging (LITI).

However, the intermediate layer 320 is not limited thereto and may have various structures. In addition, the intermediate layer 320 may include a layer which is one body over a plurality of pixel electrodes 310 or include a patterned layer to correspond to each of the plurality of pixel electrodes 310.

The opposite electrode 330 is arranged on the intermediate layer 320. The opposite electrode 330 may include a conductive material having a low work function. As an example, the opposite electrode 330 may include a (semi) transparent layer including silver (Ag), magnesium (Mg), aluminum (Al), platinum (Pt), lithium (Li), calcium (Ca), or an alloy thereof. Alternatively, the opposite electrode 330 may further include a layer including ITO, IZO, ZnO, or $In_2O_3$ on the (semi) transparent layer. The opposite electrode 330 may be formed as one body over a plurality of organic light-emitting diodes to correspond to a plurality of pixel electrodes 310.

An organic light-emitting diode OLED that constitutes the first pixel Pm in the first area DA1 overlaps the first pixel circuit PCm. That is, the pixel electrode 310 of the organic light-emitting diode OLED may overlap at least one thin-film transistor of the first pixel circuit PCm.

Figure 7:
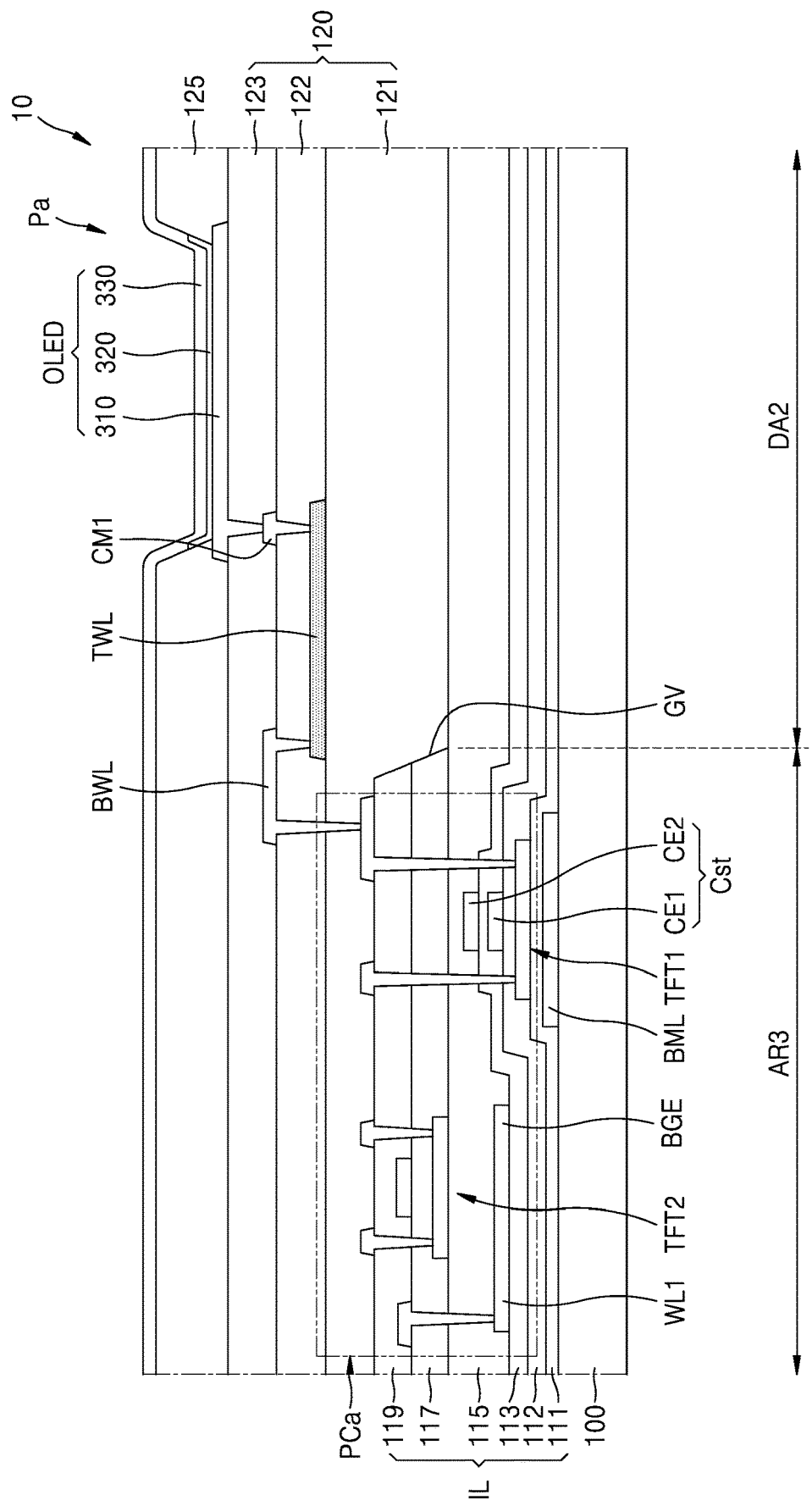
FIG. 7 is a cross-sectional view of a portion of a display panel according to an embodiment.
Figure 8:
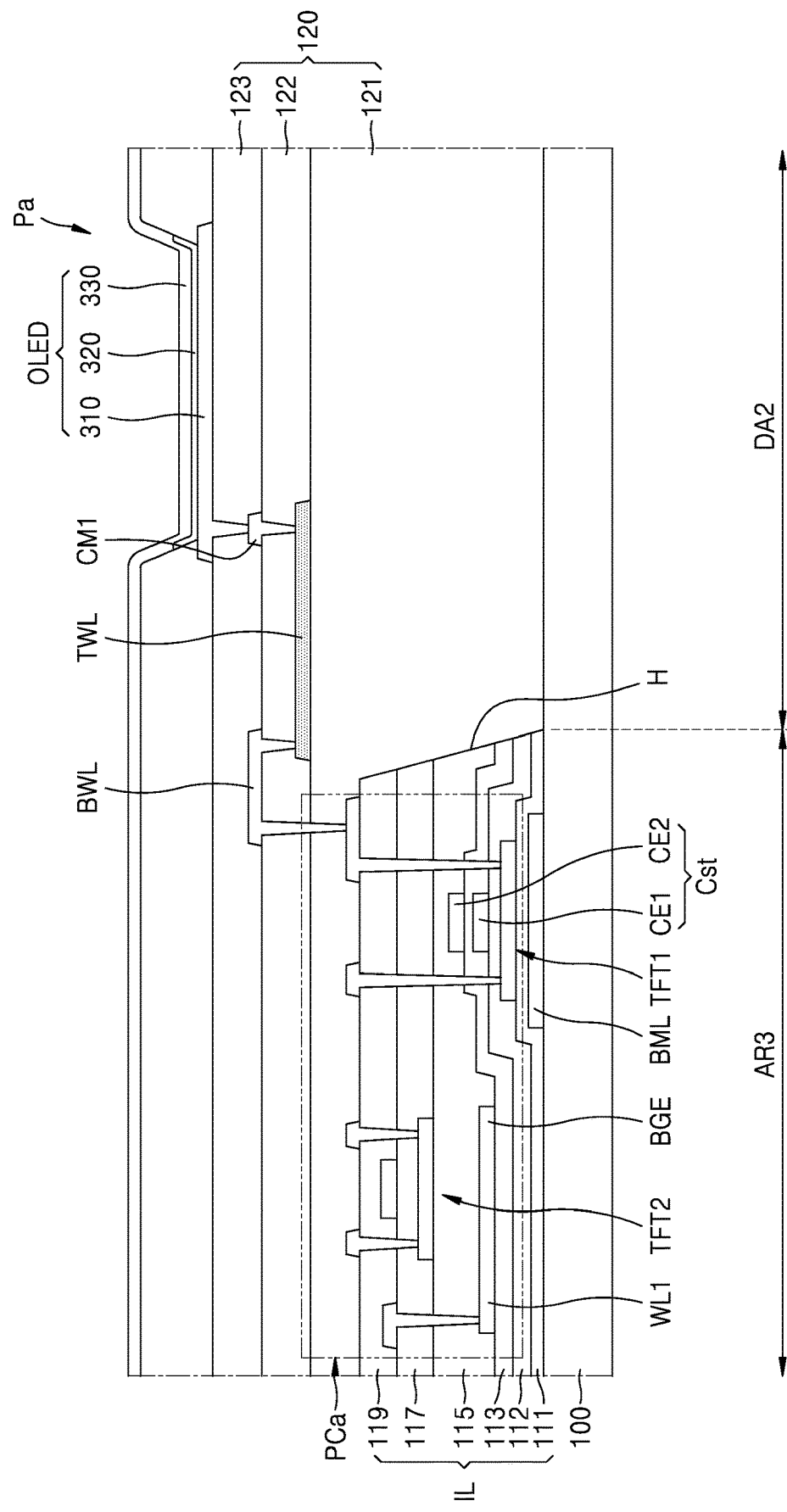
FIG. 8 is a cross-sectional view of a portion of a display panel according to an embodiment.
Figure 9:
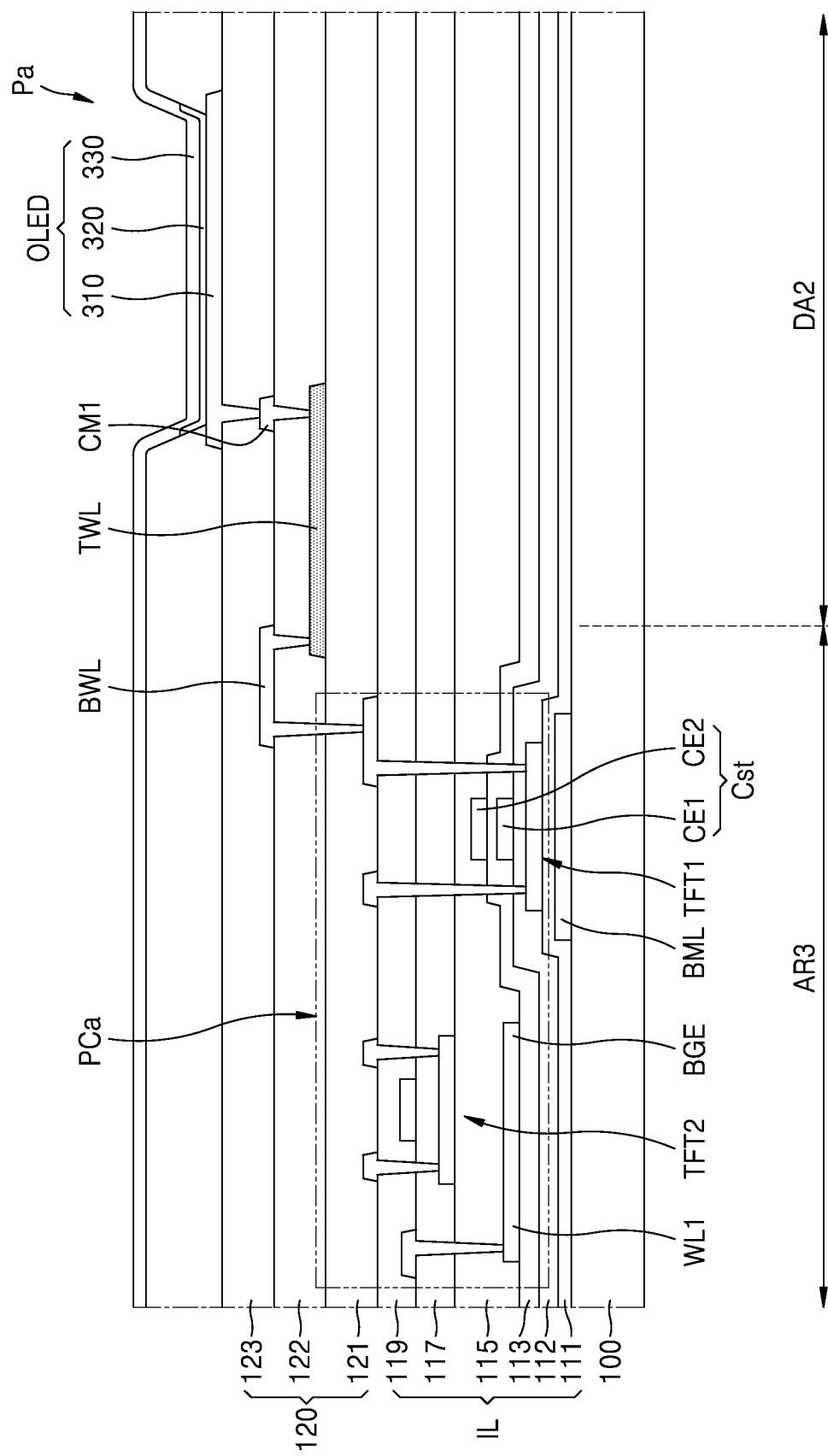
FIG. 9 is a cross-sectional view of a portion of a display panel according to an embodiment.

FIGS. 7 to 9 are cross-sectional views of a portion of the display panel 10 according to an embodiment and are cross-sectional views of a portion of the second area DA2 and the third area AR3. The third area AR3 may be the third display area DA3 or the peripheral area DPA. In FIG. 7, because the same reference numerals as those of FIG. 6 denote the same elements, repeated descriptions thereof are omitted.

Referring to FIG. 7, an organic light-emitting diode OLED may be arranged in the second area DA2 of the display panel 10, the organic light-emitting diode OLED being a second display element that constitutes the second pixel Pa. The second pixel circuit PCa connected to the second display element may be arranged in the third area AR3 of the display panel 10.

The second pixel circuit PCa may include the first thin-film transistor TFT1, the second thin-film transistor TFT2, and the storage capacitor Cst, the first thin-film transistor TFT1 including a silicon semiconductor, and the second thin-film transistor TFT2 including an oxide semiconductor. The bottom conductive layer BML may be further arranged between the substrate 100 and the second pixel circuit PCa. The bottom conductive layer BML may overlap the first thin-film transistor TFT1.

Because elements of the second pixel circuit PCa are similar to elements of the first pixel circuit PCm, descriptions of the second pixel circuit PCa are omitted.

The second pixel circuit PCa arranged in the third area AR3 may be electrically connected to the organic light-emitting diode OLED, which is the second display element arranged in the second area DA2, through the connection wiring TWL.

In an embodiment, the connection wiring TWL may be arranged on the first organic insulating layer 121 in the second area DA2. Because the connection wiring TWL is arranged on the first organic insulating layer 121, interference does not occur between the connection wiring TWL and the elements of the second pixel circuit PCa. The connection wiring TWL may overlap the second pixel circuit PCa.

The connection wiring TWL may include a transparent conductive material. As an example, the connection wiring TWL may include a transparent conducting oxide (TCO). The connection wiring TWL may include TCO such as indium tin oxide (ITO), indium zinc oxide (IZO), zinc oxide (ZnO), indium oxide ($In_2O_3$), indium gallium oxide (IGO), or aluminum zinc oxide (AZO).

One end of the connection wiring TWL may be connected to the second pixel circuit PCa through the bridge wiring BWL.

Alternatively, the bridge wiring BWL may be arranged on the second organic insulating layer 122 and connected to the thin-film transistor of the second pixel circuit PCa through contact holes.

Another end of the connection wiring TWL may be connected to the pixel electrode 310 of the organic light-emitting diode OLED through a first contact electrode CM1.

In an embodiment, an inorganic insulating layer IL of the display panel may include a groove GV, which is a recessed portion in which at least a portion of the inorganic insulating layer IL is removed, corresponding to the second area DA2.

As an example, when the buffer layer 111, the first gate insulating layer 112, the first interlayer insulating layer 113, the second interlayer insulating layer 115, the second gate insulating layer 117, and the third interlayer insulating layer 119 are collectively referred to as an inorganic insulating layer IL, the inorganic insulating layer IL may have a groove GV corresponding to the second area DA2.

The groove GV may be formed by removing a portion of the inorganic insulating layer IL. As an example, the buffer layer 111, the first gate insulating layer 112, the first interlayer insulating layer 113, and the second interlayer insulating layer 115 may be continuously arranged over the second area DA2. The second gate insulating layer 117 and the third interlayer insulating layer 119 in the second area DA2 may be removed to form the groove GV. The groove GV in the second gate insulating layer 117 and the third interlayer insulating layer 119 may be respectively formed through separate processes or simultaneously formed through the same process. In the case where the groove GV are formed through a separate process, the sidewall of the groove GV may not be formed smoothly and may have a step at an interface between the second gate insulating layer 117 and the third interlayer insulating layer 119.

The first organic insulating layer 121 having a higher light transmittance than that of the inorganic insulating layer IL may fill the groove GV. Accordingly, a light transmittance of the second area DA2 may be improved even more.

Though it is shown in FIG. 7 that the groove GV is formed in the inorganic insulating layer IL, the embodiment is not limited thereto.

As shown in FIG. 8, a hole H may be formed in the inorganic insulating layer IL to expose a portion of the top surface of the substrate corresponding to the second area DA2. The hole H of the inorganic insulating layer IL may include an opening of the buffer layer 111, an opening of the first gate insulating layer 112, an opening of the first interlayer insulating layer 113, an opening of the second interlayer insulating layer 115, an opening of the second gate insulating layer 117, and an opening of the interlayer insulating layer 119 overlapping each other. The openings may be respectively formed through separate processes or simultaneously formed through the same process. In the case where the openings are formed through separate processes, the inner surface of the hole H may not be formed smoothly and may have a step at interfaces between layers. The first organic insulating layer 121 having a high light transmittance may fill the hole H.

Though it is shown in FIGS. 7 and 8 that the hole H or the groove GV is formed in the inorganic insulating layer IL arranged in the second area DA2, the embodiment is not limited thereto. As shown in FIG. 9, the inorganic insulating layer IL may not include a hole or a groove over the second area DA2 and may be continuously arranged.

Figure 10:
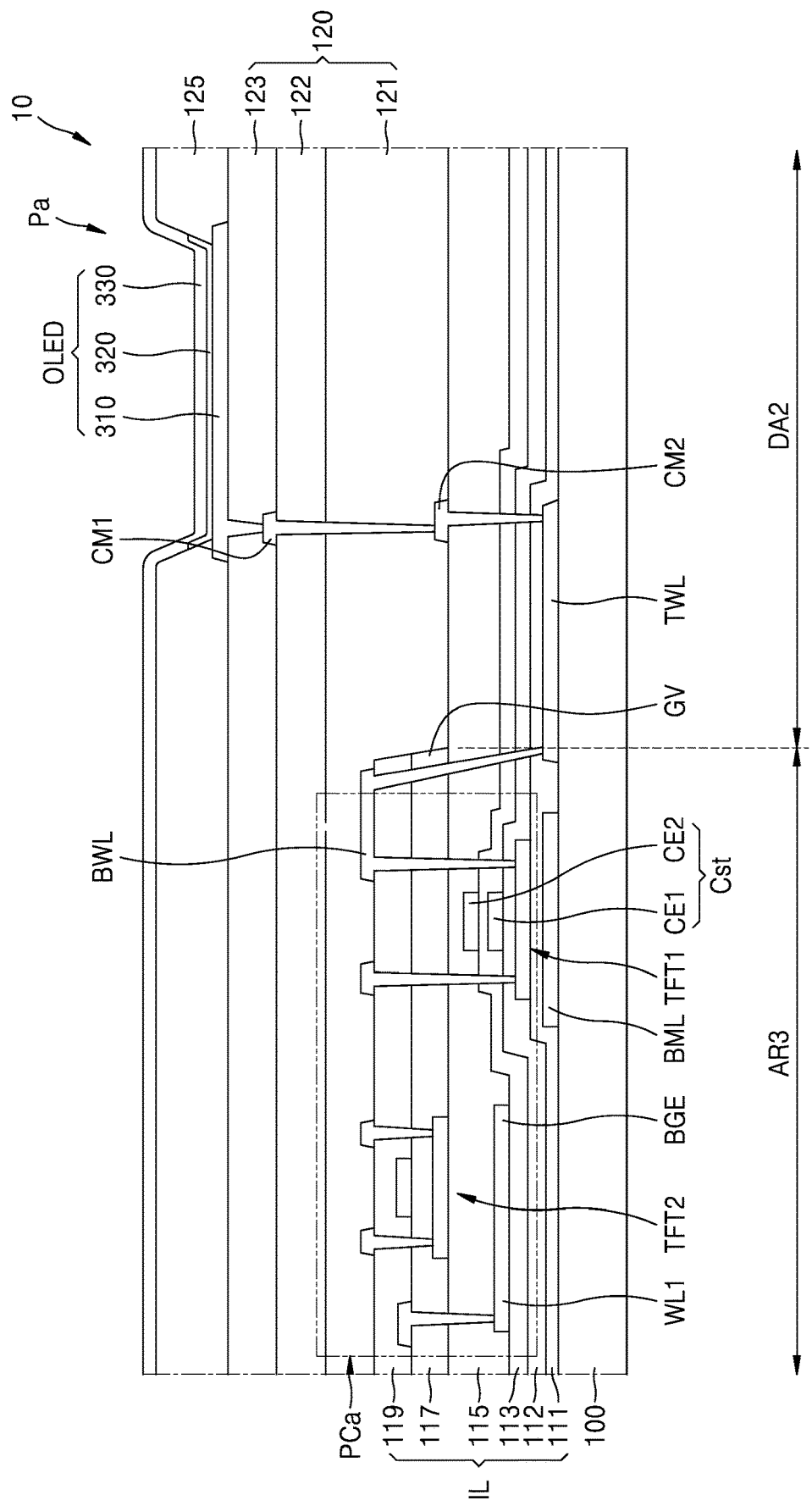
FIG. 10 is a cross-sectional view of a portion of a display panel according to an embodiment.

FIG. 10 is a cross-sectional view of a portion of a display panel 10 according to an embodiment. In FIG. 10, because the same reference numerals as those of FIG. 7 denote the same elements, repeated descriptions thereof are omitted.

Referring to FIG. 10, an organic light-emitting diode OLED may be arranged in the second area DA2 of the display panel 10, the organic light-emitting diode OLED being the second display element that constitutes the second pixel Pa. The second pixel circuit PCa connected to the second display element may be arranged in the third area AR3 of the display panel 10.

The second pixel circuit PCa may include the first thin-film transistor TFT1, the second thin-film transistor TFT2, and the storage capacitor Cst, the first thin-film transistor TFT1 including a silicon semiconductor, and the second thin-film transistor TFT2 including an oxide semiconductor. The bottom conductive layer BML may be further arranged between the substrate 100 and the second pixel circuit PCa. The bottom conductive layer BML may overlap the first thin-film transistor TFT1.

The second pixel circuit PCa arranged in the third area AR3 may be electrically connected to the organic light-emitting diode OLED, which is the second display element arranged in the second area DA2, through the connection wiring TWL.

In an embodiment, the connection wiring TWL may include the same material as the bottom conductive layer BML and be arranged in the same layer as the bottom conductive layer BML. The connection wiring TWL and the bottom conductive layer BML may include a transparent conductive material. As an example, the connection wiring TWL may include a transparent conducting oxide (TCO). The connection wiring TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The connection wiring TWL may be arranged between the substrate 100 and the buffer layer 111.

In this case, one end of the connection wiring TWL may be connected to the second pixel circuit PCa through the bridge wiring BWL. The bridge wiring BWL may be arranged on the third interlayer insulating layer 119 and connected to the thin-film transistor of the second pixel circuit PCa and the connection wiring TWL through contact holes, respectively.

Another end of the connection wiring TWL may be connected to the pixel electrode 310 of the organic light-emitting diode OLED through the first contact electrode CM1 and a second contact electrode CM2.

Because the connection wiring TWL includes the same material as that of the bottom conductive layer BML and is formed through the same process of forming the bottom conductive layer BML, a separate process of forming the connection wiring TWL does not need to be performed. Accordingly, process costs and time may be reduced.

Figure 11:
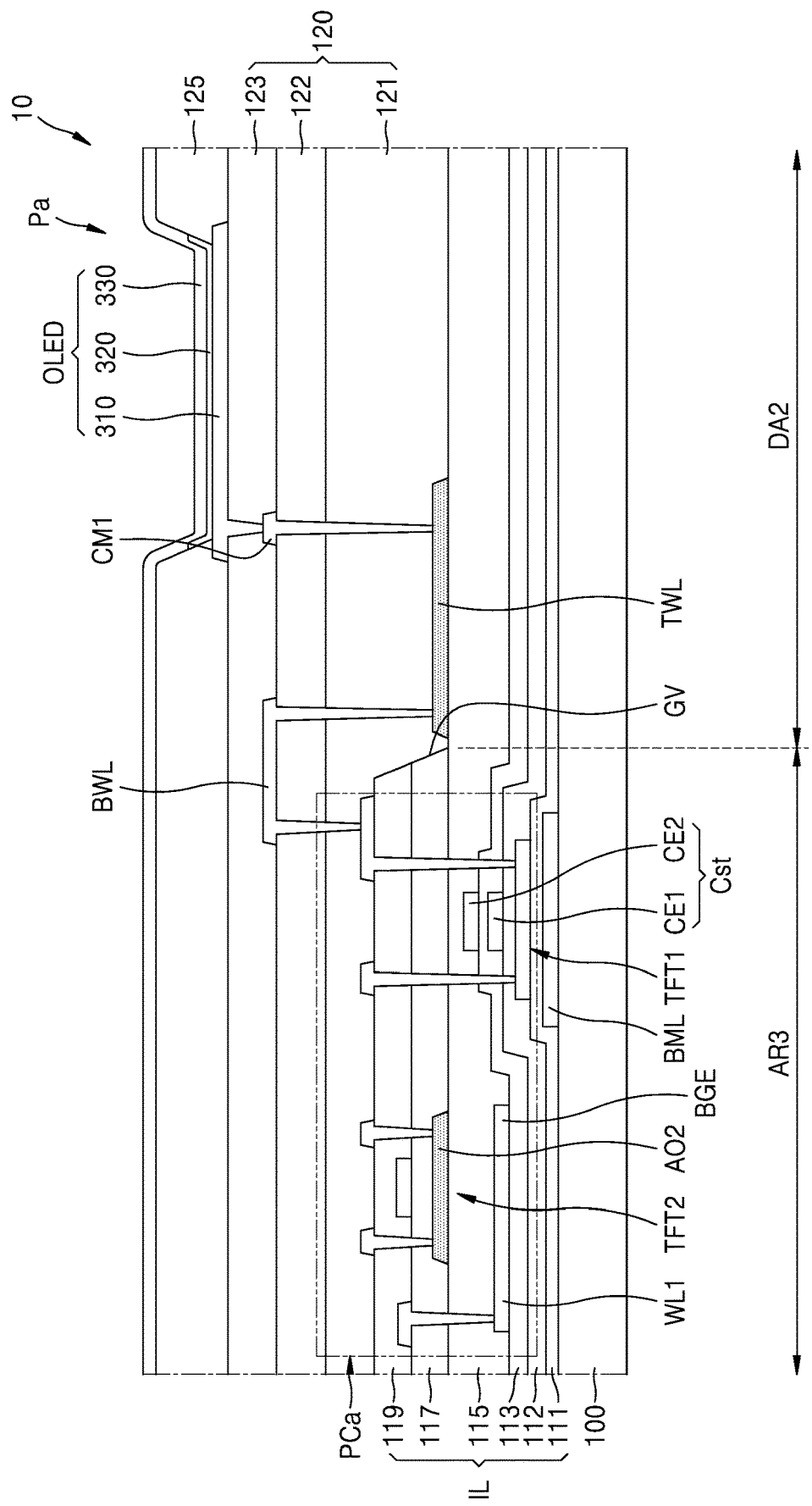
FIG. 11 is a cross-sectional view of a portion of a display panel according to an embodiment.

FIG. 11 is a cross-sectional view of a portion of the display panel 10 according to an embodiment. In FIG. 11, because the same reference numerals as those of FIG. 7 denote the same elements, repeated descriptions thereof are omitted.

Referring to FIG. 11, an organic light-emitting diode OLED may be arranged in the second area DA2 of the display panel 10, the organic light-emitting diode OLED being the second display element that constitutes the second pixel Pa. The second pixel circuit PCa connected to the second display element may be arranged in the third area AR3 of the display panel 10.

The second pixel circuit PCa may include the first thin-film transistor TFT1, the second thin-film transistor TFT2, and the storage capacitor Cst, the first thin-film transistor TFT1 including a silicon semiconductor, and the second thin-film transistor TFT2 including an oxide semiconductor. The bottom conductive layer BML may be further arranged between the substrate 100 and the second pixel circuit PCa. The bottom conductive layer BML may overlap the first thin-film transistor TFT1.

The second pixel circuit PCa arranged in the third area AR3 may be electrically connected to the organic light-emitting diode OLED, which is the second display element arranged in the second area DA2, through the connection wiring TWL.

In an embodiment, the connection wiring TWL may include the same material as that of the second semiconductor layer AO2 including an oxide semiconductor. That is, the connection wiring TWL may be formed through the same process of forming the second semiconductor layer AO2.

The connection wiring TWL may include a transparent oxide semiconductor. As an example, the connection wiring TWL may include an oxide of at least one of indium (In), gallium (Ga), stannum (Sn), zirconium (Zr), and zinc (Zn). In an embodiment, the second semiconductor layer AO2 may include In—Ga—Zn—O (IGZO) containing metal such as indium (In) and gallium (Ga) in ZnO. The connection wiring TWL may be formed by increasing carrier concentration through plasma treatment that uses a hydrogen (H)-based gas, a fluorine (F)-based gas, or a combination of these performed on the oxide semiconductor.

The connection wiring TWL may be arranged in the groove GV of the inorganic insulating layer IL. The connection wiring TWL may be arranged over the second interlayer insulating layer 115 in the second area DA2.

In this case, one end of the connection wiring TWL may be connected to the second pixel circuit PCa through the bridge wiring BWL. The bridge wiring BWL may be arranged on the second organic insulating layer 122 and connected to the thin-film transistor of the second pixel circuit PCa and the connection wiring TWL through contact holes, respectively.

Another end of the connection wiring TWL may be connected to the pixel electrode 310 of the organic light-emitting diode OLED through the first contact electrode CM1.

Because the connection wiring TWL includes the same material as that of the second semiconductor layer AO2 and is formed through the same process of forming the second semiconductor layer AO2, a separate process of forming the connection wiring TWL does not need to be performed. Accordingly, process costs and time may be reduced.

Figure 12:
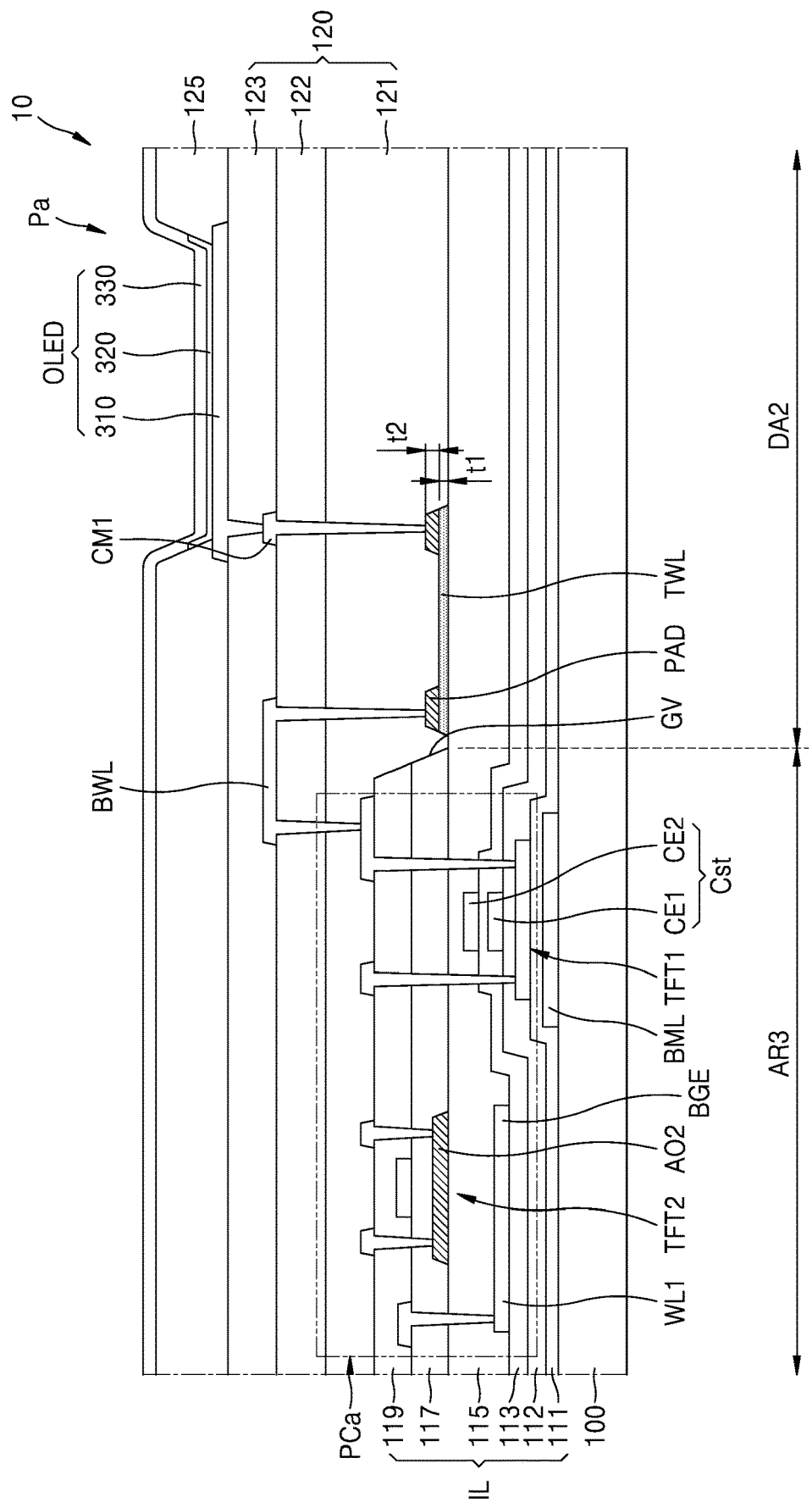
FIG. 12 is a cross-sectional view of a portion of a display panel according to an embodiment.

FIG. 12 is a cross-sectional view of a portion of the display panel 10 according to an embodiment. In FIG. 12, because the same reference numerals as those of FIG. 7 denote the same elements, repeated descriptions thereof are omitted.

Referring to FIG. 12, an organic light-emitting diode OLED may be arranged in the second area DA2 of the display panel 10, the organic light-emitting diode OLED being the second display element that implements the second pixel Pa. The second pixel circuit PCa connected to the second display element may be arranged in the third area AR3 of the display panel 10.

The second pixel circuit PCa may include the first thin-film transistor TFT1, the second thin-film transistor TFT2, and the storage capacitor Cst, the first thin-film transistor TFT1 including a silicon semiconductor, and the second thin-film transistor TFT2 including an oxide semiconductor. The bottom conductive layer BML may be further arranged between the substrate 100 and the second pixel circuit PCa. The bottom conductive layer BML may overlap the first thin-film transistor TFT1.

The second pixel circuit PCa arranged in the third area AR3 may be electrically connected to the organic light-emitting diode OLED, which is the second display element arranged in the second area DA2, through the connection wiring TWL.

In an embodiment, two opposite ends of the connection wiring TWL may include a connection pad CPAD including the same material as that of the second semiconductor layer AO2 including an oxide semiconductor. That is, the connection pad CPAD may be formed through the same process of forming the second semiconductor layer AO2.

In an embodiment, the connection wiring TWL may be arranged on the second interlayer insulating layer 115. As an example, the connection wiring TWL may include a transparent conducting oxide (TCO). As an example, the connection wiring TWL may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

The connection wiring TWL may be formed on the second interlayer insulating layer 115 before the second semiconductor layer AO2 and the connection pad CPAD are formed. The connection wiring TWL may be crystallized while passing through a curing process after etching. Accordingly, even though the connection pad CPAD is formed through a subsequent etching process, the connection wiring TWL may not be etched or damaged due to an etching selectivity to the connection pad CPAD.

The connection pad CPAD may be formed on the two opposite edges of the connection wiring TWL and may prevent the connection wiring TWL from being damaged while contact holes are formed. In addition, because the connection pad CPAD is formed, the thickness of the connection wiring TWL may be reduced, and thus, a light transmittance of the second area DA2 may be improved. A thickness t1 of the connection wiring TWL may be less than a thickness t2 of the connection pad CPAD. In an embodiment, the thickness t2 of the connection pad CPAD may be about two or three times thicker than the thickness of the connection wiring TWL.

The connection pad CPAD may include the same material as that of the second semiconductor layer AO2. That is, the connection pad CPAD may include a transparent oxide semiconductor. As an example, the connection pad CPAD may include an oxide of at least one of indium (In), gallium (Ga), stannum (Sn), zirconium (Zr), vanadium (V), hafnium (Hf), titanium (Ti), and zinc (Zn). In an embodiment, the connection pad CPAD may include In—Ga—Zn—O (IGZO) containing metal such as indium (In) and gallium (Ga) in ZnO. The connection pad CPAD may be formed by increasing carrier concentration through plasma treatment that uses a hydrogen (H)-based gas, a fluorine (F)-based gas, or a combination of these performed on the oxide semiconductor.

Figure 13:
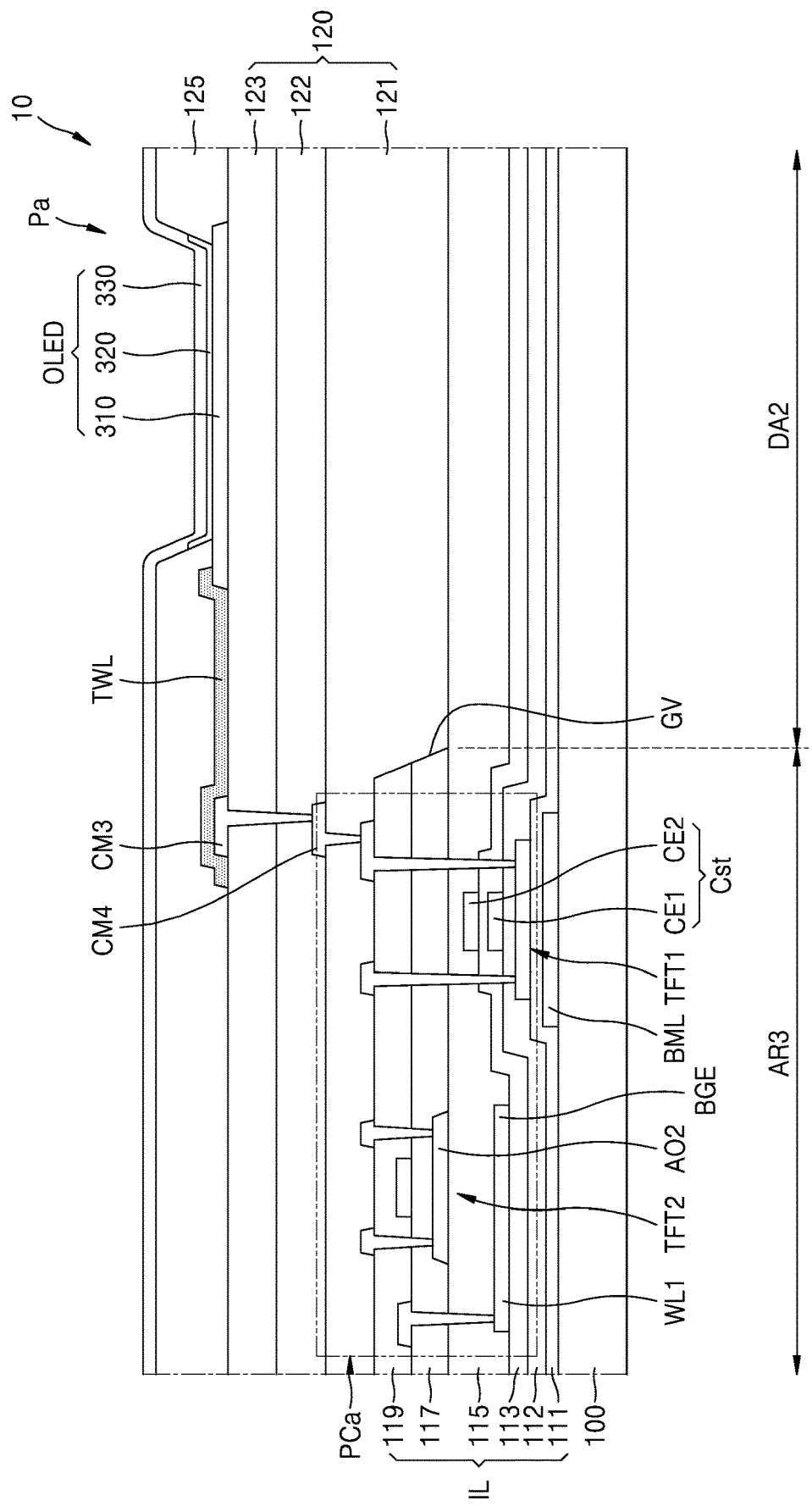
FIG. 13 is a cross-sectional view of a portion of a display panel according to an embodiment.

FIG. 13 is a cross-sectional view of a portion of the display panel 10 according to an embodiment. In FIG. 13, because the same reference numerals as those of FIG. 7 denote the same elements, repeated descriptions thereof are omitted.

Referring to FIG. 13, an organic light-emitting diode OLED may be arranged in the second area DA2 of the display panel 10, the organic light-emitting diode OLED being the second display element that implements the second pixel Pa. The second pixel circuit PCa connected to the second display element may be arranged in the third area AR3 of the display panel 10.

The second pixel circuit PCa may include the first thin-film transistor TFT1, the second thin-film transistor TFT2, and the storage capacitor Cst, the first thin-film transistor TFT1 including a silicon semiconductor and the second thin-film transistor TFT2 including an oxide semiconductor. The bottom conductive layer BML may be further arranged between the substrate 100 and the second pixel circuit PCa. The bottom conductive layer BML may overlap the first thin-film transistor TFT1.

The second pixel circuit PCa arranged in the third area AR3 may be electrically connected to the organic light-emitting diode OLED, which is the second display element arranged in the second area DA2, through the connection wiring TWL.

In an embodiment, the connection wiring TWL may be arranged on the same layer as the pixel electrode 310. The connection wiring TWL may be arranged on the organic insulating layer 120. One end of the connection wiring TWL may cover the edge of the pixel electrode 310.

Another end of the connection wiring TWL may cover a third contact electrode CM3 arranged in the third area AR3. The third contact electrode CM3 may be arranged on the same layer as the pixel electrode 310, may include the same material as that of the pixel electrode 310, and be formed through the same process of forming the pixel electrode 310.

The connection wiring TWL may be connected to the second pixel circuit PCa through the third contact electrode CM3 and/or the fourth contact electrode CM4. The third contact electrode CM3 and the fourth contact electrode CM4 may be arranged in the third area AR3 and may overlap the second pixel circuit PCa. The third contact electrode CM3 may be arranged on the third organic insulating layer 123 and may contact the fourth contact electrode CM4 through a contact hole passing through the third organic insulating layer 123 and the second organic insulating layer 122. The fourth contact electrode CM4 may be arranged on the first organic insulating layer 121 and may contact the second pixel circuit PCa through a contact hole passing through the first organic insulating layer 121.

In an embodiment, the pixel electrode 310 may include the same material as that of the connection wiring TWL. As an example, the pixel electrode 310 may include ITO/Ag/ITO. The pixel electrode 310 may be crystallized by a curing process after etching. Accordingly, when a material to be the connection wiring TWL is deposited on the pixel electrode 310 and formed through an etching process, the pixel electrode 310 may not be etched or damaged due to an etching selectivity to the connection wiring TWL.

The connection wiring TWL may include a transparent conducting oxide (TCO). As an example, the connection wiring TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Figure 14:
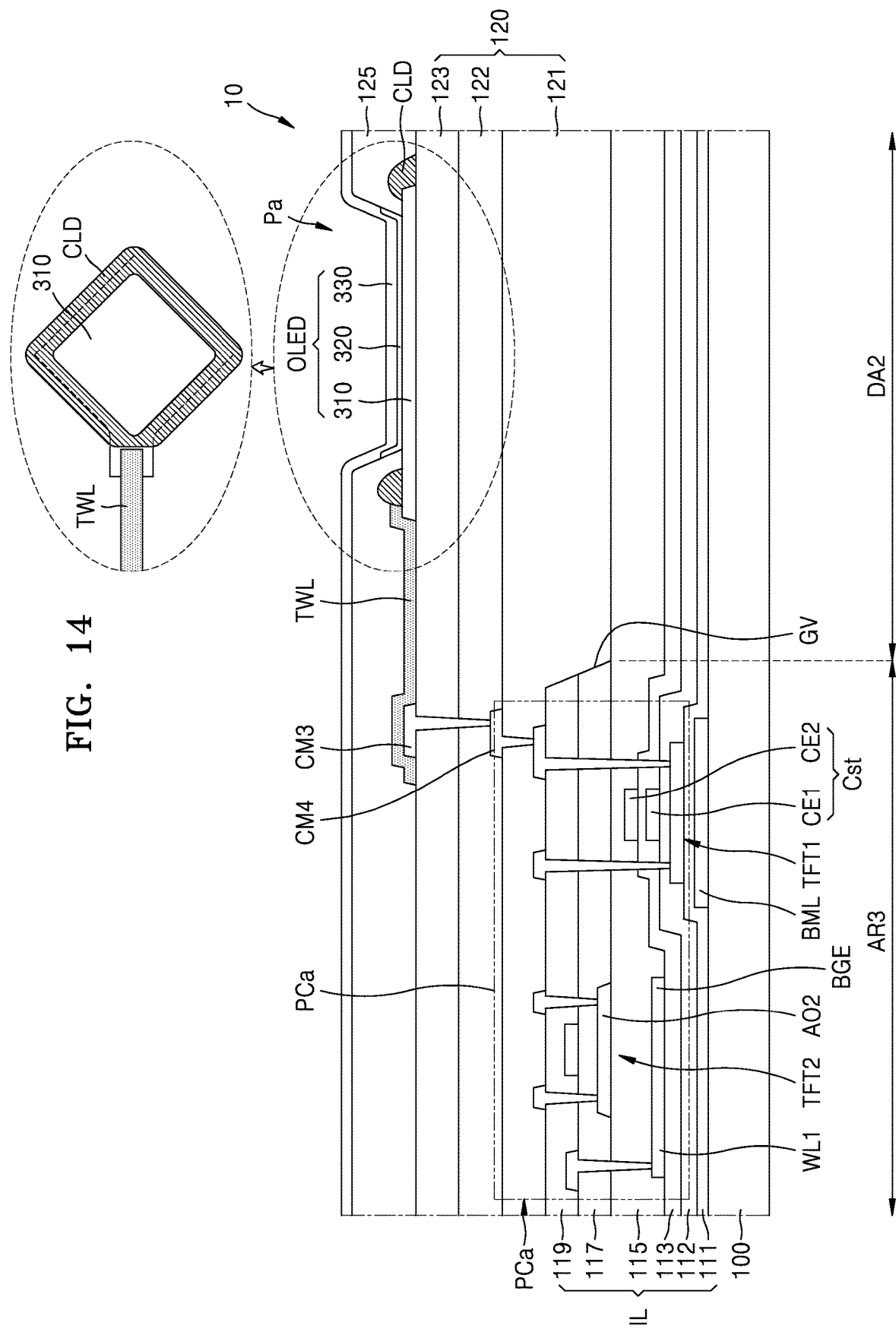
FIG. 14 is a cross-sectional view of a portion of a display panel according to an embodiment.

FIG. 14 is a cross-sectional view of a portion of the display panel 10 according to an embodiment. In FIG. 14, because the same reference numerals as those of FIG. 13 denote the same elements, repeated descriptions thereof are omitted.

Referring to FIG. 14, an organic light-emitting diode OLED may be arranged in the second area DA2 of the display panel 10, the organic light-emitting diode OLED being the second display element that constitutes the second pixel Pa. The second pixel circuit PCa connected to the second display element may be arranged in the third area AR3 of the display panel 10.

The second pixel circuit PCa may include the first thin-film transistor TFT1, the second thin-film transistor TFT2, and the storage capacitor Cst, the first thin-film transistor TFT1 including a silicon semiconductor, and the second thin-film transistor TFT2 including an oxide semiconductor. The bottom conductive layer BML may be further arranged between the substrate 100 and the second pixel circuit PCa. The bottom conductive layer BML may overlap the first thin-film transistor TFT1.

The second pixel circuit PCa arranged in the third area AR3 may be electrically connected to the organic light-emitting diode OLED, which is the second display element arranged in the second area DA2, through the connection wiring TWL.

In an embodiment, the connection wiring TWL may be arranged in the same layer as the pixel electrode 310. The connection wiring TWL may be arranged on the organic insulating layer 120. One end of the connection wiring TWL may cover the edge of the pixel electrode 310.

Another end of the connection wiring TWL may cover the third contact electrode CM3 arranged in the third area AR3. The third contact electrode CM3 may be arranged on the same layer as the pixel electrode 310, may include the same material as that of the pixel electrode 310, and be formed through the same process of forming the pixel electrode 310.

An embodiment may further include a cladding layer CLD arranged between the pixel electrode 310 and the pixel-defining layer 125, exposing the central portion of the pixel electrode 310, and covering the edge of the pixel electrode 310. In a plan view, the cladding layer CLD may be provided in a closed shape. As an example, the cladding layer CLD may be provided in a ring shape.

The cladding layer CLD may include an organic insulating material such as polyimide, polyamide, an acrylic resin, benzocyclobutene, hexamethyldisiloxane (HMDSO), and a phenolic resin and be formed through spin coating, etc.

Because the cladding layer CLD is formed, a damage to the lateral surface of the pixel electrode 310 may be reduced during a process of forming the connection wiring TWL.

Figure 15:
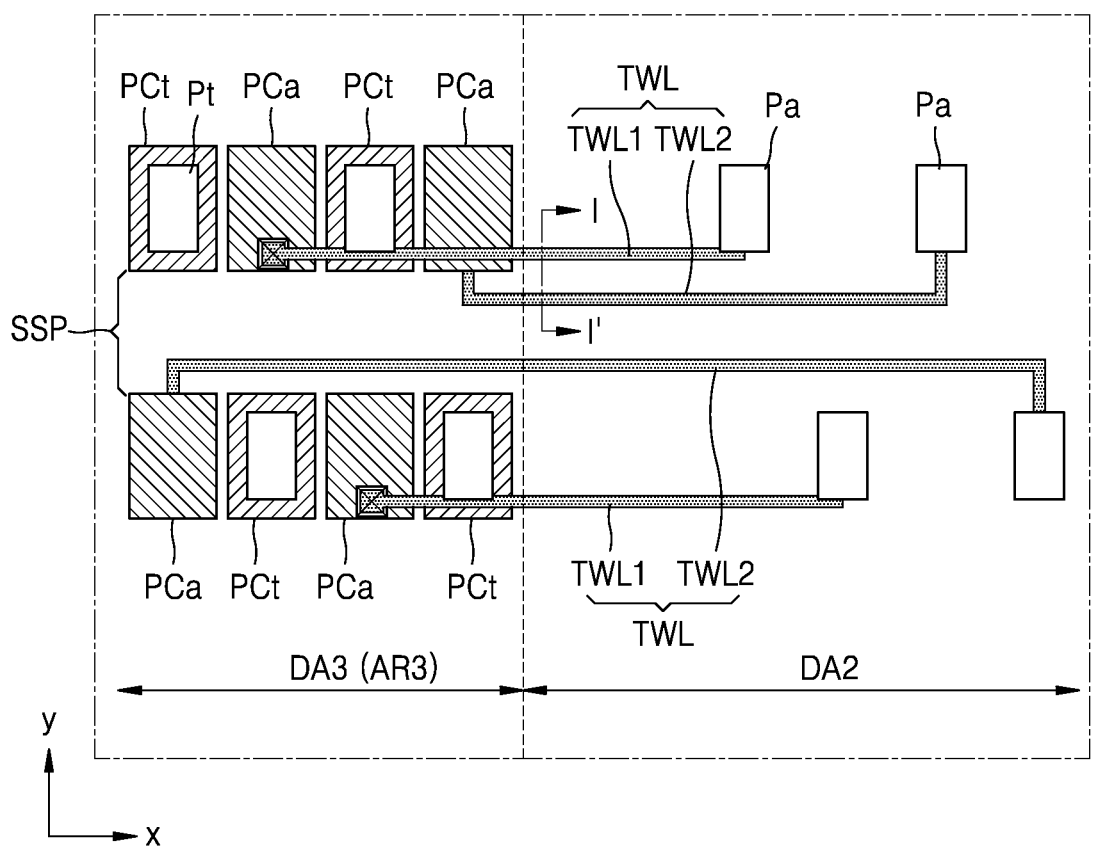
FIG. 15 is a plan layout view of a portion of a display panel according to an embodiment.

FIG. 15 is a plan layout view of a portion of a display panel according to an embodiment. In an embodiment, FIG. 15 shows a portion of the second area DA2 and the third display area DA3 arranged on one side thereof.

Referring to FIG. 15, the second pixels Pa are arranged in the second area DA2. The second pixels Pa may be arranged in various arrangement structures such as a pentile structure, a stripe structure, and a delta structure. The second pixel circuits PCa, the third pixels Pt, and the third pixel circuits PCt may be arranged in the third display area DA3, the second pixel circuits PCa driving the second pixels Pa and the third pixel circuits PCt driving the third pixels Pt.

In the third display area DA3, the second pixel circuits PCa and the third pixel circuits PCt may be alternately arranged along the x-direction and/or the y-direction. The third pixels Pt may respectively overlap the third pixel circuits PCt driving the third pixels Pt.

The second pixel circuits PCa may each be connected to a display element that constitutes the second pixel Pa through the connection wiring TWL. In an embodiment, the connection wiring TWL may include a first connection wiring TWL1 and a second connection wiring TWL2 arranged on different layers.

The first connection wiring TWL1 may be a connection wiring arranged on the first organic insulating layer 121 in the above embodiments. The second connection wiring TWL2 may be a connection wiring arranged under the first organic insulating layer 121 in the above embodiments.

Because the first connection wiring TWL1 is arranged on the first organic insulating layer 121, the first connection wiring TWL1 may be arranged over the second pixel circuit PCa and the third pixel circuit PCt and may overlap the second pixel circuit PCa and the third pixel circuit PCt. Accordingly, a degree of freedom of the first connection wiring TWL1 may be secured.

The second connection wiring TWL2 may be arranged under the first organic insulating layer 121 and arranged on the same layer which constitutes the second pixel circuits PCa and the third pixel circuits PCt. Accordingly, the second connection wiring TWL2 may be arranged in a separation portion SSP of the third display area DA3 in which the second pixel circuits PCa and the third pixel circuits PCt are not arranged. The separation portion SSP may be provided along the x-direction between the second pixel circuits PCa and the third pixel circuits PCt disposed adjacent to each other along the y-direction. The second connection wiring TWL2 may extend in the x-direction in the separation portion SSP.

In FIG. 15, though description has been made to the display panel including the third display area DA3, the embodiment is not limited thereto. As an example, an embodiment is applicable to the case where the second pixel circuit PCa is arranged in the third area AR3, which is the peripheral area, as in FIG. 3.

FIGS. 16 to 21 are cross-sectional view of the display panel, taken along line I-I' of FIG. 15 according to an embodiment.

Figure 16:
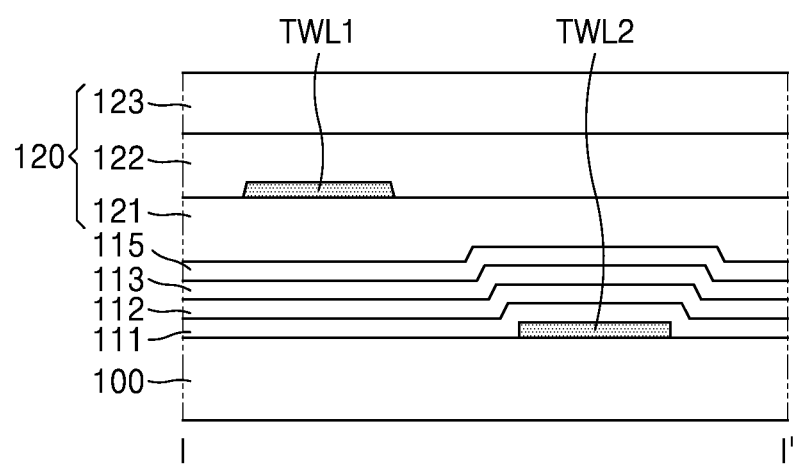
FIGS. 16, 17, 18, 19, 20 and 21 are cross-sectional view of the display panel, taken along line I-I' of FIG. 15 according to an embodiment.

Referring to FIG. 16, the connection wiring TWL includes the first connection wiring TWL1 and the second connection wiring TWL2. The first connection wiring TWL1 may be arranged on the first organic insulating layer 121 as described with reference to FIGS. 7 to 9.

The second connection wiring TWL2 may be arranged between the substrate 100 and the buffer layer 111. As described with reference to FIG. 10, the second connection wiring TWL2 may be arranged in the same layer as the bottom conductive layer BML.

Figure 17:
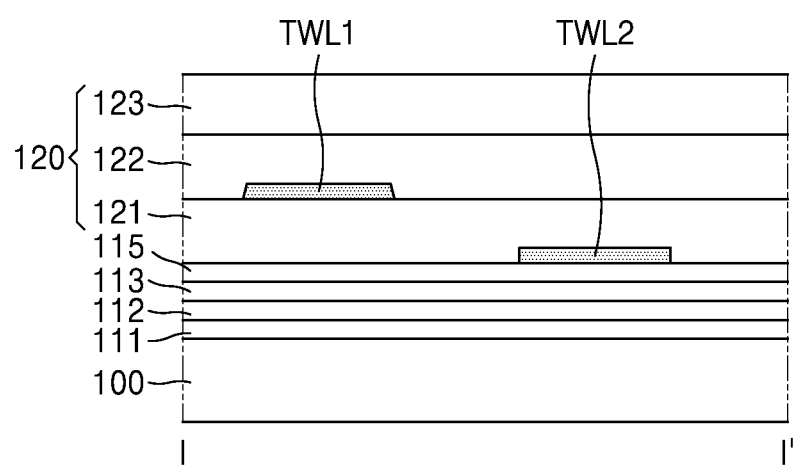

Referring to FIG. 17, the first connection wiring TWL1 may be arranged on the first organic insulating layer 121 as described with reference to FIGS. 7 to 9. The second connection wiring TWL2 may be arranged on the second interlayer insulating layer 115. That is, the second connection wiring TWL2 may be arranged on the same layer as the second semiconductor layer AO2 as described with reference to FIGS. 11 and 12.

Figure 18:
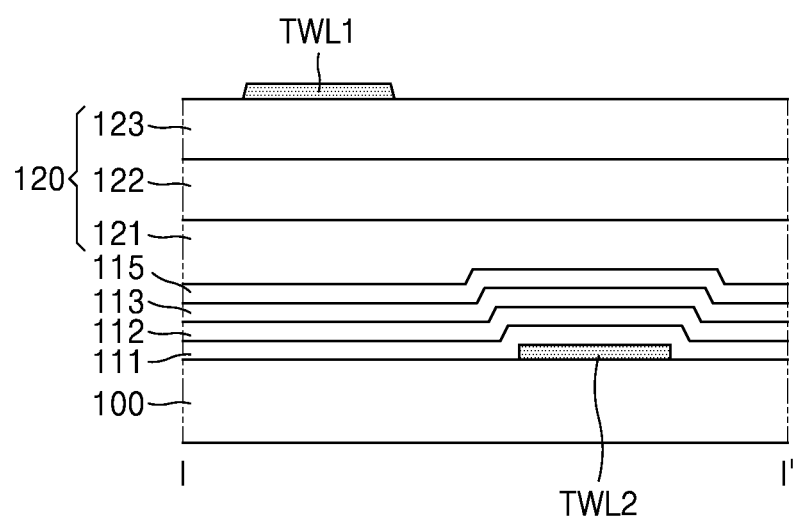

Referring to FIG. 18, the first connection wiring TWL1 may be arranged on the same layer as the pixel electrode 310 as described with reference to FIGS. 13 and 14. That is, the first connection wiring TWL1 may be arranged on the organic insulating layer 120. The first connection wiring TWL1 may be arranged on the third organic insulating layer 123.

The second connection wiring TWL2 may be arranged between the substrate 100 and the buffer layer 111. The second connection wiring TWL2 may be arranged on the same layer as the bottom conductive layer BML as described with reference to FIG. 10.

Figure 19:
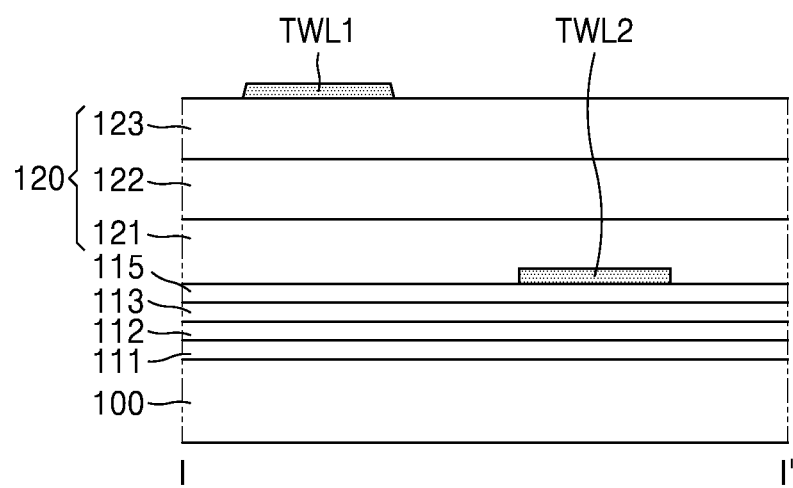

Referring to FIG. 19, the first connection wiring TWL1 may be arranged on the same layer as the pixel electrode 310 as described with reference to FIGS. 13 and 14. That is, the first connection wiring TWL1 may be arranged on the organic insulating layer 120. The first connection wiring TWL1 may be arranged on the third organic insulating layer 123.

The second connection wiring TWL2 may be arranged on the second interlayer insulating layer 115. That is, the second connection wiring TWL2 may be arranged on the same layer as the second semiconductor layer AO2 as described with reference to FIGS. 11 and 12.

Figure 20:
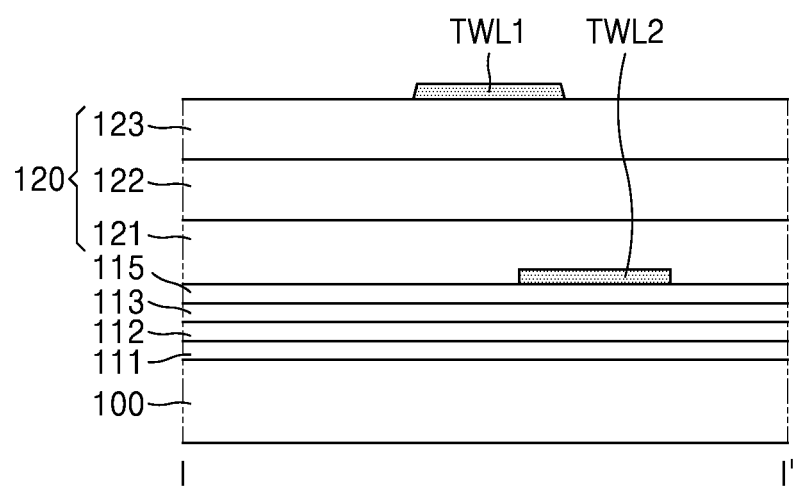

Though it is shown in FIGS. 16 to 19 that the first connection wiring TWL1 does not overlap the second connection wiring TWL2, the embodiment is not limited thereto. As shown in FIG. 20, the first connection wiring TWL1 may overlap a portion of the second connection wiring TWL2.

Figure 21:
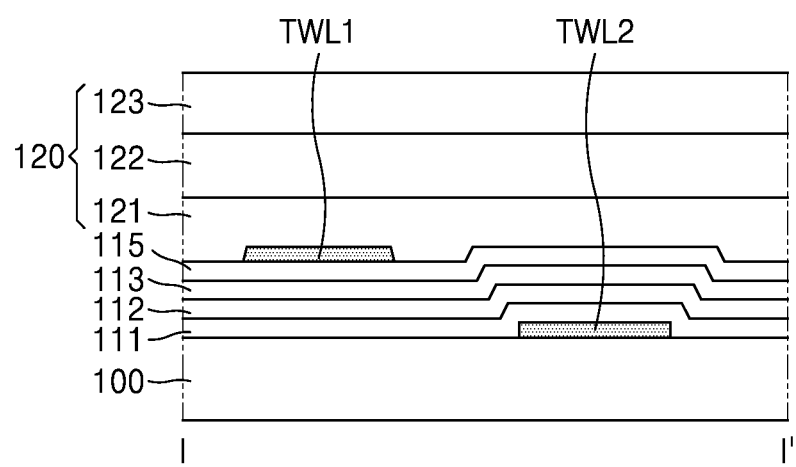

In addition, it is shown in FIGS. 16 to 20 that the first connection wiring TWL1 is arranged on the organic insulating layer 120 and the second connection wiring TWL2 is arranged under the organic insulating layer 120, the embodiment is not limited thereto. As shown in FIG. 21, both the first connection wiring TWL1 and the second connection wiring TWL2 may be arranged under the organic insulating layer 120.

In an embodiment, the first connection wiring TWL1 may be arranged on the second interlayer insulating layer 115. That is, as described with reference to FIGS. 11 and 12, the first connection wiring TWL1 may be arranged on the same layer as the second semiconductor layer AO2. The second connection wiring TWL2 may be arranged between the substrate 100 and the buffer layer 111. As described with reference to FIG. 10, the second connection wiring TWL2 may be arranged in the same layer as the bottom conductive layer BML.

Likewise, in an embodiment, both the first connection wiring TWL1 and the second connection wiring TWL2 may be arranged on the organic insulating layer 120. However, various modifications may be made.

As described above, in the display panel and the display apparatus according to an embodiment, the pixel circuit is not arranged in a component area. Accordingly, a larger transmission area may be secured and a transmittance may be improved.

In addition, because the display panel and the display apparatus according to an embodiment include the first connection wiring and the second connection wiring arranged over the first organic insulating layer, a degree of freedom of the connection wiring arrangement may be secured.

The scope of the present discourse is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
    a substrate including a first area, a second area, and a third area, a plurality of first display elements being arranged in the first area, and a plurality of second display elements being arranged in the second area;
    a plurality of first pixel circuits arranged in the first area and respectively connected to the plurality of first display elements;
    a plurality of second pixel circuits arranged in the third area and respectively connected to the plurality of second display elements;
    an inorganic insulating layer covering the plurality of first pixel circuits and the plurality of second pixel circuits and including a groove portion in which the inorganic insulating layer is removed;
    a first organic insulating layer covering the inorganic insulating layer and filling the groove portion; and
    a plurality of connection wirings respectively connecting the plurality of second pixel circuits to the plurality of second display elements and disposed to overlap the groove portion in a plan view,
    wherein the plurality of connection wirings include a first connection wiring and a second connection wiring, the first connection wiring being disposed on the first organic insulating layer.

2. The display panel of claim 1, further comprising a bottom conductive layer arranged in the first area and arranged between the substrate and the plurality of first pixel circuits,
    wherein the second connection wiring is arranged on in a same layer as the bottom conductive layer.

3. The display panel of claim 1, wherein each of the plurality of first pixel circuits includes a first thin-film transistor and a second thin-film transistor, the first thin-film transistor including a first semiconductor layer that includes a silicon semiconductor and the second thin-film transistor including a second semiconductor layer that includes an oxide semiconductor, and
    wherein the second connection wiring is arranged on a same layer as the second semiconductor layer.

4. The display panel of claim 3, further comprising a connection pad arranged on an edge of the second connection wiring,
    wherein a thickness of the connection pad is greater than a thickness of the second connection wiring.

5. The display panel of claim 1, further comprising a second organic insulating layer arranged on the first organic insulating layer,
    wherein the plurality of first display elements and the plurality of second display elements are arranged on the second organic insulating layer, and
    wherein the first connection wiring is arranged between the first organic insulating layer and the second organic insulating layer.

6. The display panel of claim 1, wherein each of the plurality of first display elements includes a pixel electrode arranged on the first organic insulating layer, and
    wherein the first connection wiring is arranged on a same layer as the pixel electrode and covers an edge of the pixel electrode.

7. The display panel of claim 6, further comprising a cladding layer surrounding at least a portion of the edge of the pixel electrode,
    wherein the cladding layer is provided in a ring shape.

8. The display panel of claim 6, further comprising a cladding layer surrounding at least a portion of the edge of the pixel electrode,
    wherein the cladding layer is provided in a ring shape.

9. The display panel of claim 1, further comprising a plurality of third display elements and a plurality of third pixel circuits respectively connected to the plurality of third display elements, the plurality of third pixel circuits being arranged in the third area,
    wherein the plurality of third pixel circuits are alternately arranged with the plurality of second pixel circuits in the third area along a direction in which the plurality of connection wirings extend.

10. The display panel of claim 9, wherein the first connection wiring overlaps at least a portion of the plurality of third pixel circuits, and
    wherein the second connection wiring does not overlap at least a portion of the plurality of third pixel circuits.

11. A display apparatus comprising:
    a display panel including a first area, a second area, and a third area, a plurality of first display elements being arranged in the first area, and a plurality of second display elements being arranged in the second area; and
    a component arranged below the display panel to correspond to the second area,
    wherein the display panel includes:
    a substrate;
    a plurality of first pixel circuits arranged in the first area of the display panel and respectively connected to the plurality of first display elements;
    a plurality of second pixel circuits arranged in the third area and respectively connected to the plurality of second display elements;
    an inorganic insulating layer covering the plurality of first pixel circuits and the plurality of second pixel circuits and including a groove portion in which the inorganic insulating layer is removed;
    a first organic insulating layer covering the inorganic insulating layer and filling the groove portion; and
    a plurality of connection wirings respectively connecting the plurality of second pixel circuits to the plurality of second display elements and disposed to overlap the groove portion in a plan view, wherein the plurality of connection wirings include a first connection wiring and a second connection wiring, the first connection wiring being disposed on the first organic insulating layer and the second connection wiring being disposed under the first organic insulating layer.

12. The display apparatus of claim 11, further comprising a bottom conductive layer arranged in the first region and arranged between the substrate and the plurality of first pixel circuits, wherein the second connection wiring is arranged on a same layer as the bottom conductive layer.

13. The display apparatus of claim 11, wherein each of the plurality of first display elements includes a pixel electrode arranged on the first organic insulating layer, and wherein the first connection wiring is arranged on a same layer as the pixel electrode and covers an edge of the pixel electrode.

14. The display apparatus of claim 11, wherein each of the plurality of first pixel circuits includes a first thin-film transistor and a second thin-film transistor, the first thin-film transistor including a first semiconductor layer that includes a silicon semiconductor and the second thin-film transistor including a second semiconductor layer that includes an oxide semiconductor, and wherein the second connection wiring is arranged on a same layer as the second semiconductor layer.

15. The display apparatus of claim 11, further comprising an inorganic insulating layer arranged between the substrate and the first organic insulating layer, wherein the inorganic insulating layer includes a hole or a groove disposed corresponding to the second area.

16. The display apparatus of claim 11, wherein the component includes a photographing element.

* * * * *